US007974420B2

(12) United States Patent
Yoshizawa et al.

(10) Patent No.: US 7,974,420 B2
(45) Date of Patent: Jul. 5, 2011

(54) MIXED AUDIO SEPARATION APPARATUS

(75) Inventors: Shinichi Yoshizawa, Osaka (JP); Tetsu Suzuki, Osaka (JP); Yoshihisa Nakatoh, Kanagawa (JP)

(73) Assignee: Panasonic Corporation, Osaka (JP)

( * ) Notice: Subject to any disclaimer, the term of this patent is extended or adjusted under 35 U.S.C. 154(b) by 1118 days.

(21) Appl. No.: 11/665,265

(22) PCT Filed: Apr. 11, 2006

(86) PCT No.: PCT/JP2006/307673

§ 371 (c)(1),
(2), (4) Date: Apr. 12, 2007

(87) PCT Pub. No.: WO2006/120829

PCT Pub. Date: Nov. 16, 2006

(65) Prior Publication Data

US 2009/0067647 A1 Mar. 12, 2009

(30) Foreign Application Priority Data

May 13, 2005 (JP) ................................ 2005-141939

(51) Int. Cl.
*H03G 5/00* (2006.01)
*H04B 15/00* (2006.01)

(52) U.S. Cl. ............ 381/98; 381/94.2; 381/97; 702/190

(58) Field of Classification Search .................... 381/56, 381/61, 66, 97, 98, 106, 119, 94.1–94.3; 702/190, 191

See application file for complete search history.

(56) References Cited

U.S. PATENT DOCUMENTS 5,568,519 A * 10/1996 Baier et al. .................... 375/343

(Continued)

FOREIGN PATENT DOCUMENTS

JP 2001-134613 5/2001

(Continued)

OTHER PUBLICATIONS

S.H. Srinivasan et al., Harmonicity and dynamics based audio separation, Acoustics, Speech, and Signal Processing, 2003. Proceedings. (ICASSP '03). 2003 IEEE International conference on, vol. 5, pp. 640-643, 2003.

(Continued)

*Primary Examiner* — Xu Mei
(74) *Attorney, Agent, or Firm* — Wenderoth, Lind & Ponack, LLP.

(57) ABSTRACT

A mixed audio separation system (100) which separates a specific audio from among a mixed audio (S100) includes a local frequency information generation unit (105) which obtains pieces of local frequency information (S103) corresponding to local reference waveforms (S102), based on the local reference waveforms (S102) and an analysis waveform which is the waveform of the mixed audio (S100). Each of the local reference waveforms (S102) (i) constitutes a part of a reference waveform for analyzing a predetermined frequency, (ii) has a predetermined temporal/spatial resolution and (iii) includes at least one of an amplification spectrum and a phase spectrum in the predetermined frequency. The system includes: a specific audio's frequency feature value extraction unit (106) which performs pattern matching between a first set which is the pieces of local frequency information and a second set of pieces of frequency information (S103) of a predetermined specific audio, and extracts the first set of the pieces of local frequency information (S103), based on a result of the pattern matching; and an audio signal generation unit which generates a signal of the specific audio, based on the first set of the pieces of local frequency information (S103) extracted by the specific audio's frequency feature value extraction unit.

17 Claims, 28 Drawing Sheets

U.S. PATENT DOCUMENTS

| | | | | |
|---|---|---|---|---|
| 6,317,703 | B1 * | 11/2001 | Linsker | 702/190 |
| 6,845,164 | B2 * | 1/2005 | Gustafsson | 381/94.1 |
| 7,010,514 | B2 * | 3/2006 | Maekawa et al. | 706/20 |
| 7,292,697 | B2 * | 11/2007 | Tatsuta et al. | 381/302 |
| 7,454,333 | B2 * | 11/2008 | Ramakrishnan et al. | 704/228 |
| 7,650,279 | B2 * | 1/2010 | Hiekata et al. | 704/205 |
| 2001/0037195 | A1 | 11/2001 | Acero et al. | |
| 2007/0025564 | A1 * | 2/2007 | Hiekata et al. | 381/94.2 |
| 2007/0127735 | A1 | 6/2007 | Miura et al. | |
| 2007/0154033 | A1 * | 7/2007 | Attias | 381/94.1 |
| 2008/0304672 | A1 * | 12/2008 | Yoshizawa et al. | 381/56 |

FOREIGN PATENT DOCUMENTS

| | | |
|---|---|---|
| JP | 2002-236494 | 8/2002 |

OTHER PUBLICATIONS

Hirokazu Kameoka et al., Audio Stream Segregation Based on Time-Space Clustering Using Gaussian Kernel 2-Dimensional Model, Acoustics, Speech, and Signal Processing, 2005. Proceedings. (ICASSP '05). 2005 IEEE International Conference on, vol. 3, pp. 5-8, Mar. 2005.

Hiroki Nakano et al., "Ueiburetto ni yoru Singo Shori to Gazo Shori (Signal Processing and Image Processing through Wavelet)", Kyoritsu Press, Aug. 15, 1999, pp. 35-39 and 49-52.

Seiichi Nakagawa, "Patan Joho Shori (Pattern Image Processing)", Maruzen Co., Ltd., pp. 14-19, Mar. 30, 1999.

Supplementary European Search Report issued Apr. 24, 2008 in a European application that is a foreign counterpart to the present application.

Quatieri et al., "An Approach to Co-Channel Talker Interference Suppression Using a Sinusoidal Model for Speech," IEEE Transactions on Acoustics, Speech, and Signal Processing, 38 (Jan. 1990), vol. 38, No. 1, New York, US.

Keren et al., "Multiresolution Time-Frequency Analysis of Polyphonic Music," Department of Electrical Engineering Technion—Israel Institute of Technology, Haifa, Israel, IEEE (Oct. 1998).

Wang et al, "Analysis of Speech Segments Using Variable Spectral/Temporal Resolution," Department of Electrical and Computer Engineering Old Dominion University, Norfolk, VA (Oct. 1996).

* cited by examiner (a)

S1000

Local frequency information DB

Used reference frequency : 1 KHz

Temporal resolution : 1 ms (One-cycle length of used reference frequency 1 KHz), no overlapped local reference waveform

| Time point (starting point of first cycle) | | 0.0 ms | 0.3 ms | 0.6 ms | 0.9 ms | 1.2 ms | ··· | 30000.0 ms |
|---|---|---|---|---|---|---|---|---|
| Local frequency information | First cycle | 0.3 | 77.2 | 30.1 | -52.6 | 93.9 | ··· | 0.2 |
| | Second cycle | 125.2 | 35.2 | 45.8 | 77.7 | -55.7 | ··· | -1.3 |
| | Third cycle | -34.5 | -12.7 | -69.1 | 13.7 | 131.2 | ··· | 0.1 |
| | Fourth cycle | -0.5 | 81.5 | 74.9 | -52.8 | 95.6 | ··· | 0.0 |
| | Fifth cycle | 25.6 | 125.3 | 19.7 | -37.1 | 0.7 | ··· | 0.0 |

FIG. 21
(a)
S1000
Local frequency information DB
Used reference frequency : 2 KHz
Temporal resolution : first cycle 0.5 ms, second cycle 0.5 ms, third and fourth cycles 1.0 ms, no overlapped local reference waveform
| Time point (starting point of first cycle) | | 0.0 ms | 0.3 ms | 0.6 ms | 0.9 ms | 1.2 ms | ··· | 30000.0 ms |
|---|---|---|---|---|---|---|---|---|
| Local frequency information | First cycle | 0.1 | 73.2 | 32.1 | 72.1 | 53.9 | ··· | 0.1 |
| | Second cycle | -0.5 | 17.9 | 35.8 | -11.0 | -65.7 | ··· | -1.0 |
| | Third to fourth cycles | -24.6 | 2.7 | -6.1 | 13.3 | 111.0 | ··· | 0.2 |
(b)
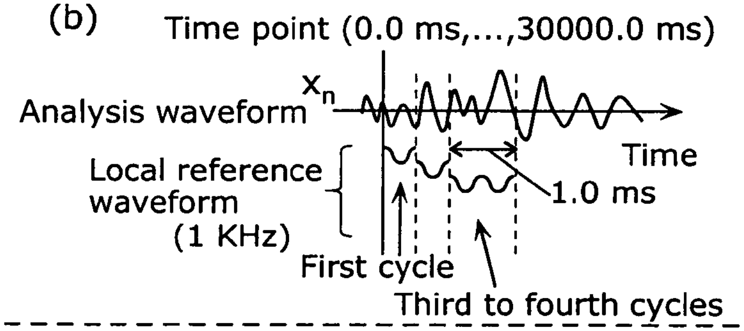
(c)
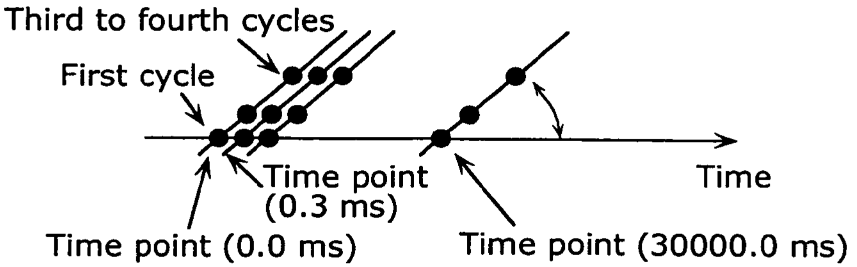

FIG. 22

S1000

Local frequency information DB

Used reference frequency : 1 KHz

Temporal resolution : 1 ms (One-cycle length of used reference frequency 1 KHz), no overlapped local reference waveform

| Time point (starting point of first cycle) | | 0.0 ms | 0.3 ms | 0.6 ms | 0.9 ms | 1.2 ms | ··· | 30000.0 ms |
|---|---|---|---|---|---|---|---|---|
| Local frequency information | First cycle | 0.3 | 77.2 | 30.1 | -52.6 | 93.9 | ··· | 0.2 |
| | Second cycle | 125.2 | 35.2 | 45.8 | 77.7 | -55.7 | ··· | -1.3 |
| | Third cycle | -34.5 | -12.7 | -69.1 | 13.7 | 131.2 | ··· | 0.1 |
| Frequency information (Total sum of first to third cycles) | | 91.0 | 99.7 | 6.8 | 38.8 | 169.4 | | -1.0 |

$X^1_f$ $X^2_f$ $X^3_f$ $X_f=X^1_f+X^2_f+X^3_f$

FIG. 23

S1000

Local frequency information DB

Used reference frequency : 1 KHz

Temporal resolution : 1 ms (One-cycle length of used reference frequency 1 KHz), no overlapped local reference waveform

| Time point (starting point of first cycle) | | 0.0 ms | 0.3 ms | 0.6 ms | 0.9 ms | 1.2 ms | ··· | 30000.0 ms |
|---|---|---|---|---|---|---|---|---|
| Local frequency information | First cycle | 0.3 | 77.2 | 30.1 | -52.6 | 93.9 | ··· | 0.2 |
| | Second cycle | 125.2 | 35.2 | 45.8 | 77.7 | -55.7 | ··· | -1.3 |
| | Third cycle | -34.5 | -12.7 | -69.1 | 13.7 | 131.2 | ··· | 0.1 |
| | Fourth cycle | -0.5 | 81.5 | 74.9 | -52.8 | 95.6 | ··· | 0.0 |
| | Fifth cycle | 25.6 | 125.3 | 19.7 | -37.1 | 0.7 | ··· | 0.0 |

FIG. 24

S1000

Local frequency information DB

Used reference frequency : 1 KHz

Temporal resolution : 1 ms (One-cycle length of used reference frequency 1 KHz), no overlapped local reference waveform

| Time point (starting point of first cycle) | | 0.0 ms | 0.3 ms | 0.6 ms | 0.9 ms | 1.2 ms | ··· | 30000.0 ms |
|---|---|---|---|---|---|---|---|---|
| Local frequency information | First cycle | 0.3 | 77.2 | 30.1 | -52.6 | 93.9 | ··· | 0.2 |
| | Second cycle | 125.2 | 35.2 | 45.8 | 77.7 | -55.7 | ··· | -1.3 |
| | Third cycle | -34.5 | -12.7 | -69.1 | 13.7 | 131.2 | ··· | 0.1 |
| | Fourth cycle | -0.5 | 81.5 | 74.9 | -52.8 | 95.6 | ··· | 0.0 |
| | Fifth cycle | 25.6 | 125.3 | 19.7 | -37.1 | 0.7 | ··· | 0.0 |

Determine frequency resolution

| Time point | 0.0 ms | 1.0 ms | 2.0 ms | 3.0 ms | 4.0 ms | ... | 30000.0 ms |
|---|---|---|---|---|---|---|---|
| Local frequency information | 0.3 | 77.2 | 30.1 | -52.6 | 93.9 | ... | 0.2 |

FIG. 26

S1000

Local frequency information DB

Used reference frequency : 1 KHz
Temporal resolution : 1 ms (One-cycle length of used reference frequency 1 KHz), no overlapped local reference waveform

| Time point | 0.0 ms | 1.0 ms | 2.0 ms | 3.0 ms | 4.0 ms | ··· | 30000.0 ms |
|---|---|---|---|---|---|---|---|
| Local frequency information | 0.3 | 77.2 | 30.1 | -52.6 | 93.9 | ··· | 0.2 |

Used reference frequency : 2 KHz
Temporal resolution : 0.5 ms (One-cycle length of used reference frequency 1 KHz), no overlapped local reference waveform

| Time point | 0.0 ms | 0.5 ms | 1.0 ms | 1.5 ms | 2.0 ms | ··· | 30000.0 ms |
|---|---|---|---|---|---|---|---|
| Local frequency information | 0.1 | 24.2 | -10.1 | -13.2 | 36.1 | ··· | 0.0 |

Used reference frequency : 4 KHz
Temporal resolution : 0.25 ms (One-cycle length of used reference frequency 1 KHz), no overlapped local reference waveform

| Time point | 0.0 ms | 0.25 ms | 0.5 ms | 0.75 ms | 1.0 ms | ··· | 30000.0 ms |
|---|---|---|---|---|---|---|---|
| Local frequency information | 0.1 | -13.1 | 12.1 | -9.3 | 23.0 | ··· | 0.0 |

| Time point | 0.0 ms | 1.0 ms | 2.0 ms | 3.0 ms | 4.0 ms | ··· | 30000.0 ms |
|---|---|---|---|---|---|---|---|
| Local frequency information | 0.3 | 77.2 | 30.1 | -52.6 | 93.9 | ··· | 0.2 |

| Time point | 0.0 ms | 1.0 ms | 2.0 ms | 3.0 ms | 4.0 ms | ··· | 30000.0 ms |
|---|---|---|---|---|---|---|---|
| Local frequency information | 0.3 | 77.2 | 30.1 | -52.6 | 93.9 | ··· | 0.2 |

MIXED AUDIO SEPARATION APPARATUS

TECHNICAL FIELD

The present invention relates to a mixed audio separation apparatus which separates a desired audio from among a mixed audio.

BACKGROUND ART

Conventionally, there has been introduced a mixed audio separation apparatus as an apparatus which separates a desired audio from among a mixed audio. In mixed audio separation processing, a mixed audio is subjected to a frequency analysis so as to generate a spectrogram where the y axis represents frequency, the x axis represents time, and the power intensity of each of the points are shown by gray scale. In addition, in the processing, the desired audio is separated from the mixed audio on the spectrogram. Through this processing, audio separation performance becomes high. As for a frequency conversion method from an audio to a spectrogram like this; that is, an audio frequency analysis method, the Fourier transform is generally used. Therefore, the Fourier transform plays an important role in the mixed audio separation processing.

As conventional arts for performing frequency analyses, the cosine transform (for example, refer to Reference 2) and the wavelet transform (for example, refer to Reference 1) are known in addition to the above-mentioned Fourier transform (for example, refer to the References 1 and 2). In these conventional arts, a frequency analysis is performed using a cross-correlation (convolution) between an analysis waveform and each reference waveform which has a predetermined time width.

In the Fourier transform, a frequency analysis is performed using cosine waveforms and sine waveforms each of which has a time width determined based on a temporal resolution (spatial resolution) and a frequency resolution (each of the cosine waveforms and sine waveforms is a reference waveform having a value of zero in a time segment other than the time width).

Here, determining the time width of each reference waveform is equivalent to determining a reference frame width (time width) in the Fourier transform. In addition, a frequency analysis may be performed by multiplying an analysis waveform with a window function which has a value other than zero in a target segment (time segment where a reference waveform is present).

FIG. 1 is a diagram illustrating a method of the Fourier transform (discrete Fourier transform). Frequency information (an amplification spectrum and a phase spectrum) of an analysis waveform is obtained by calculating, using Expression 1, a cross-correlation (convolution) between the analysis waveform shown in FIG. 1(*c*) and each reference waveform (FIG. 1(*b*)). The used reference waveforms are a cosine wave and a sine wave each of which has a time width including N-points in a sampling point shown in FIG. 1(*a*). Here, an index k in Expression 1 is an index indicating a reference frequency, and in the Fourier transform, pieces of frequency information of plural reference frequencies are to be obtained in parallel. A great index value shows that a high frequency is used to obtain an analysis result.

$$X_k = \sum_{n=1}^{N} x_n e^{-j\frac{2\pi kn}{N}} \quad (k = 1, 2, \ldots, N)$$ [Expression 1]

where $$x_n \quad (n = 1, 2, \ldots, N)$$ [Expression 2]

is a value obtained by sampling an analysis waveform, $$X_k \ (k=1, 2, \ldots, N)$$ [Expression 3]

is frequency information corresponding to the analysis waveform, and $$e^{-j\frac{2\pi kn}{N}} = \cos\left(\frac{2\pi kn}{N}\right) - j\sin\left(\frac{2\pi kn}{N}\right)$$ [Expression 4]

is a value constituted of a cosine waveform and a sine waveform each of which has a time width including N-points; that is, a value of the reference waveform.

In the Fourier transform, when the time width of a reference waveform is set, both the values of a temporal resolution and a frequency resolution are automatically determined. The "temporal resolution" mentioned here means the length of a time segment which is averaged at the time of obtaining the cross-correlation (convolution) between the analysis waveform and each reference waveform. The "frequency resolution" mentioned here means the frequency band width which the frequency components of the analysis waveform pass through, and the band width includes the reference frequency.

FIG. 2 is a diagram indicating a relationship between the reference waveforms each having a predetermined time width and frequency characteristics obtained when performing a frequency analysis of the analysis waveform using the reference waveforms. FIG. 2 shows frequency characteristics in the case where frequency analysis is performed using three-types of temporal resolutions; that is, a 1-cycle temporal resolution, a 2-cycle temporal resolution and a 3-cycle temporal resolution which are listed from left to right in FIG. 2. FIG. 2 shows the relationships between the reference waveforms and frequency characteristics in the case where the frequency analysis is performed.

It is known from FIG. 2 that a frequency resolution is low when a frequency analysis is performed by increasing a temporal resolution using the 1-cycle cosine waveform as a reference waveform, and that a frequency resolution is high when a frequency analysis is performed by lowering a temporal resolution using the 3-cycle cosine waveform (whose time width is tripled compared to the 1-cycle cosine waveform). In this way, in the conventional arts, a temporal resolution (the length of a time segment to be averaged at the time of obtaining the cross-correlation between an analysis waveform and each reference waveform) and a frequency resolution are in a trade-off relationship.

Note that, in the case of the Fourier transform of the analysis waveform having serial values, a frequency analysis is to be performed using a cross-correlation (convolution) between the analysis waveform and each reference waveform indicated by integral in stead of using Σ operation in Expression 1.

In the cosine transform, a frequency analysis is performed using a cosine waveform having a time width determined based on a temporal resolution (spatial resolution) and a frequency resolution (the cosine waveform is a reference waveform having a value of zero in a time segment other than the time width).

FIG. 3 is a diagram illustrating the cosine transform (discrete cosine transform). Frequency information (which is represented as a combination of an amplification spectrum and a phase spectrum) of an analysis waveform is obtained by calculating, using Expression 5 and Expression 6, a cross-correlation (convolution) between an analysis waveform and each reference waveform which are shown in FIG. 3(*c*), (FIG. 3(*b*)). The used reference waveform is a cosine wave having a time width including N-points in the sampling point shown in FIG. 3(*a*) (the cosine waveform is a reference waveform having a value of zero in a time segment other than the time width). Here, an index k in Expression 5 and Expression 6 is an index indicating a reference frequency, and in the cosine transform, pieces of frequency information of plural reference frequencies are to be obtained in parallel. A great index value shows that a high frequency is used to obtain an analysis result.

$$X_k = \sum_{n=1}^{N} x_n c_k \cos\frac{(2n-1)\pi k}{2N} \quad (k = 1, 2, \ldots, N)$$ [Expression 5]

$$c_k=1\ (k=0),\ c_k=\sqrt{2}\ (k=2, \ldots, N)$$ [Expression 6]

where $$x_n\ (n=1, 2, \ldots, N)$$ [Expression 7]

is a value obtained by sampling an analysis waveform, $$X_k\ (k=1, 2, \ldots, N)$$ [Expression 8]

is frequency information corresponding to the analysis waveform.

In the cosine transform, when the time width of a reference waveform is set, both of a temporal resolution (the length of a time segment to be averaged at the time of obtaining the cross-correlation between an analysis waveform and each reference waveform) and a frequency resolution are automatically determined. This mechanism is the same as that of the Fourier transform (refer to FIG. 2).

In the case of the cosine transform in the analysis waveform having serial values, a frequency analysis is performed using, in Expression 5, a cross-correlation (convolution) between the analysis waveform and each reference waveform indicated by integral.

In the wavelet transform, a frequency analysis is performed using a wavelet basis function having a time width determined based on a temporal resolution (spatial resolution) and a frequency resolution.

FIG. 4 is a diagram illustrating the wavelet transform. In FIG. 4, the frequency information (an amplification spectrum and a phase spectrum) of an analysis waveform is obtained by calculating the cross-correlation (convolution) between the analysis waveform shown in FIG. 4(*c*) and the reference waveform shown in FIG. 4(*a*) according to the expression shown in FIG. 4(*b*); that is Expression 9 which uses a wavelet basis function (the reference waveform having a value of zero in a time segment other than a time width) which is a reference waveform having the predetermined time width shown in FIG. 4(*a*).

$$(W_\psi x)(b, a) = \frac{1}{\sqrt{a}}\int x_t \overline{\psi\left(\frac{t-b}{a}\right)} dt$$ [Expression 9]

where $x_t$ is an analysis waveform.

$$\psi\left(\frac{t-b}{a}\right)$$ [Expression 10]

is a wavelet basis function.

In the wavelet transform, when the time width of a wavelet basis function is determined, both of the temporal resolution (the length of a time segment to be averaged at the time of obtaining the cross-correlation between an analysis waveform and each reference waveform) and the frequency resolution are automatically determined. This mechanism is the same as that of the Fourier transform (refer to FIG. 2).

Note that, in the wavelet transform, it is possible to set a temporal resolution (or a frequency resolution) independently for each reference frequency. On the other hand, in the Fourier transform, all the reference frequencies are to have the same temporal resolution (time width of a reference time window) and frequency resolution, and thus it is impossible to determine a temporal resolution and a frequency resolution independently for each reference frequency. Note that the following is also true of in the wavelet transform; a frequency resolution is automatically determined based on the corresponding temporal resolution; and vice versa.

In the above description, Mexican Hat is used as the wavelet basis function used here, but it should be noted that there are other wavelet basis functions such as Daubechies, Meyer and Gabor in the wavelet transform.

Reference 1*: "Ueiburetto ni yoru Shingo Shori to Gazo Shori* (Signal Processing and Image Processing through Wavelet)", pp. 35 to 39, pp. 49 to 52, Hiroki Nakano and other two authors, Aug. 15, 1999, Kyoritsu Press.

Reference 2*: "Patan Joho Shori* (Pattern Image Processing)", pp. 14 to 19, Seiichi Nakagawa, Mar. 30, 1999, Maruzen CO. Ltd.

DISCLOSURE OF INVENTION

Problems that Invention is to Solve

In the conventional arts, a temporal resolution (the length of a time segment to be averaged at the time of obtaining the cross-correlation between an analysis waveform and each reference waveform) and a frequency resolution (a frequency band width, which includes a reference frequency, which the frequency components of the analysis waveform pass through) interfere with each other. Therefore, the frequency resolution is low when the time width of the reference waveform is shortened so as to obtain a high temporal resolution, and the temporal resolution is high when the time width of the reference waveform is lengthened so as to obtain a high frequency resolution. Therefore, there is a problem that it is impossible to set a temporal resolution and a frequency resolution independently of each other.

For example, in a mixed audio separation system, in order to extract a musical sound from among a mixed audio made up of a spontaneous audio and a musical sound, there is a need to analyze, as an analysis of the spontaneous audio, a waveform change in a narrow time needs to be analyzed by increasing the temporal resolution, and as an analysis of the musical sound, a frequency change in a narrow frequency band needs to be analyzed by increasing the frequency resolution. Therefore, with respect to a time-frequency region where both of them are mixed, there is a need to increase in parallel, both of the temporal resolution (the length of a time segment to be averaged at the time of obtaining the cross-correlation between an analysis waveform and each reference waveform) and the frequency resolution (the frequency band width, which includes a reference frequency, which the frequency components of the analysis waveform pass through). However, the conventional arts do not allow setting, in parallel, a high temporal resolution and a high frequency resolution which are in a trade-off relationship. Therefore, it is impossible to extract an audio which needs to be extracted from among a mixed audio with a high accuracy.

Thus, the present invention has been conceived in consideration to the problem, and aims to provide a mixed audio separation apparatus or the like which is capable of separating a specific audio from among a mixed audio with a high accuracy. The separation is performed based on the result as if a frequency analysis were performed by setting, in parallel, a high temporal resolution (the length of a time segment to be averaged at the time of obtaining the cross-correlation between an analysis waveform and each reference waveform) and a high frequency resolution (a frequency band width, which includes a reference frequency, which the frequency components of the analysis waveform pass through).

Means to Solve the Problems

In order to achieve the above-object, a mixed audio separation apparatus according to the present invention separates a specific audio from among a mixed audio made up of audios. The apparatus includes a local frequency information generation unit which obtains pieces of local frequency information corresponding to local reference waveforms, based on the local reference waveforms and an analysis waveform which is the waveform of the mixed audio. Each of the local reference waveforms (i) constitutes a part of a reference waveform for analyzing a predetermined frequency, (ii) has a predetermined temporal/spatial resolution and (iii) includes at least one of an amplification spectrum and a phase spectrum in the predetermined frequency. The apparatus includes: a specific audio's frequency feature value extraction unit which performs pattern matching between a first set which is the pieces of local frequency information and a second set of pieces of frequency information of a predetermined specific audio, and extracts the first set of the pieces of local frequency information, based on a result of the pattern matching; and an audio signal generation unit which generates a signal of the specific audio, based on the first set of the pieces of local frequency information extracted by the specific audio's frequency feature value extraction unit.

This makes it possible to set a temporal resolution and a frequency resolution independently of each other. Through comparison between (i) the set of pieces of local frequency information which have been respectively subjected to a frequency analysis with plural frequency resolutions (temporal resolutions) and (ii) the set of frequency information of a predetermined specific audio, it becomes possible to obtain a result as if the frequency analysis were performed by increasing, in parallel, both the temporal resolutions and the frequency resolutions. Accordingly, it becomes possible to extract an audio desired to be extracted from among a mixed audio with a high accuracy.

In addition, the above-mentioned mixed audio separation apparatus may further include a reference waveform's time width determination unit which determines the time width of the reference waveform, based on a predetermined frequency resolution.

Preferably, the reference waveform includes a cosine waveform or a sine waveform, and the reference waveform's time width determination unit determines, based on the predetermined frequency resolution, the time width of the reference waveform so that the reference waveform includes an integral number of cycles of a cosine waveform or an integral number of cycles of a sine waveform.

This makes it easier to design a frequency band pass filter for analyzing an analysis waveform.

Further preferably, the integral number of cycles is one.

This makes it possible to perform a frequency analysis using a high temporal resolution.

In addition, the above-mentioned mixed audio separation apparatus may further include a frequency resolution input receiving unit which receives an input of a frequency resolution, and in the apparatus, the reference waveform's time width determination unit may determine the time width of the reference waveform, based on the inputted frequency resolution.

This makes it possible to control a frequency resolution based on the nature of the analysis waveform and an application specification.

In addition, the above-mentioned mixed audio separation apparatus may further include a reference waveform segmentation unit which segments the reference waveform, based on the predetermined temporal/spatial resolution and so that the resulting pieces of local reference waveforms are temporally overlapped with each other, so as to generate the pieces of local reference waveforms.

This makes it easier to design a frequency band pass filter for analyzing an analysis waveform.

In addition, the reference waveform segmentation unit may segment the reference waveform so as to generate the pieces of local reference waveforms having a plurality of temporal/spatial resolutions.

This makes it possible to set plural temporal resolutions which are in accordance with the temporal nature of the analysis waveform.

In addition, the above-mentioned mixed audio separation apparatus may further include a temporal/spatial resolution input receiving unit which receives an input of a temporal/spatial resolution, and the reference waveform segmentation unit may segment the reference waveform, based on the inputted temporal/spatial resolution, so as to generate the local reference waveforms.

This makes it possible to control a frequency resolution based on the nature of the analysis waveform, an application specification and the like.

The frequency analysis apparatus according to another aspect of the present invention performs a frequency analysis of an analysis waveform using a reference waveform for analyzing a predetermined frequency. The frequency analysis apparatus includes a local frequency information generation unit and an analysis waveform frequency feature value extraction unit. The local frequency information generation unit obtains plural pieces of local frequency information corresponding to the local reference waveforms based on plural local reference waveforms and the analysis waveform. Each of the local reference waveforms constitutes a part of the reference waveform, has a predetermined temporal/spatial resolution and includes at least one of the amplification spectrum and the phase spectrum in the predetermined frequency. The analysis waveform frequency feature value extraction unit extract frequency feature value included in the analysis waveform using a predetermined frequency resolution, using, as a set, the plural pieces of local frequency information obtained by the local frequency information generation unit and based on the set and frequency information corresponding to the analysis waveform.

The points of the present invention will be described with reference to FIG. 5 to FIG. 9.

FIG. 5 is a diagram illustrating an overall structure of the present invention. In the example of FIG. 5, the time width of a reference waveform is determined based on a predetermined frequency resolution as shown in FIG. 5(*a*). More specifically, a 3-cycle cosine waveform is assumed to be a reference waveform as shown in FIG. 5(*b*). For example, the time width of the reference waveform is set so that the frequency resolution is approximately 15 Hz because there is a need to set a high frequency resolution in the case of separating three people's voices from a mixed audio.

Here, in the case of performing a frequency analysis using the conventional discrete cosine transform technique, a temporal resolution (the length of a time segment to be averaged at the time of obtaining the cross-correlation between an analysis waveform and each reference waveform) is determined based on the time width of the reference waveform, the temporal resolution corresponds to the time width of the 3-cycle cosine waveform, and thus the temporal resolution is low. This makes it impossible to represent a fine temporal structure (a frequency information change at a time interval which is narrower than the time width of the 3-cycle cosine waveform) of the analysis waveform.

Hence, in the present invention, a reference waveform is temporally segmented based on a desired temporal resolution. For example, in the case of analyzing an audio, the reference waveform is segmented at a temporal interval which is narrower than the length of a standard waveform so that the structure of the standard waveform of the audio can be viewed. In the example of FIG. 5, three local reference waveforms are generated by segmenting the reference waveform into 1-cycle cosine waveforms as shown in FIG. 5(*c*). Here, the temporal resolution (the length of a time segment to be averaged at the time of obtaining the cross-correlation between an analysis waveform and each reference waveform) is the time width of the 1-cycle cosine waveform, and the time width is narrow compared with the time width of a 3-cycle cosine waveform. In other words, a high temporal resolution is set independently of the frequency resolution (where the respective three local reference waveforms are extracted from an identical reference waveform).

Next, three pieces of local frequency information are obtained by performing a frequency analysis using the three local reference waveforms as shown in FIG. 5(*c*). These pieces of local frequency information are obtained by calculating the cross-correlation (convolution) between the analysis waveform and each local reference waveform, using each local reference waveform instead of the reference waveform used in the conventional frequency analysis technique.

Here is considered the relationship between the frequency information in the conventional discrete cosine transform technique and these three pieces of local frequency information in the present invention. The frequency information is obtained using reference waveform which is a 3-cycle cosine waveform, and the pieces of local frequency information are obtained using the local reference waveforms temporally segmented from the 3-cycle cosine waveform. In the example case of FIG. 5, the frequency information obtainable through the conventional discrete cosine transform technique is represented by Expression 11.

$$X_f = \sum_{n=start}^{end\ of\ third\ cycle} x_n c_{kf} \cos\frac{(2n-1)\pi k_f}{2N} \quad \text{[Expression 11]}$$

In addition, these three pieces of local frequency information in the present invention are respectively represented by Expression 12, 13 and 14.

$$X_f^1 = \sum_{n=start}^{end\ of\ first\ cycle} x_n c_{kf} \cos\frac{(2n-1)\pi k_f}{2N} \quad \text{[Expression 12]}$$

$$X_f^2 = \sum_{n=start\ of\ second\ cycle}^{end\ of\ second\ cycle} x_n c_{kf} \cos\frac{(2n-1)\pi k_f}{2N} \quad \text{[Expression 13]}$$

$$X_f^3 = \sum_{n=start\ of\ third\ cycle}^{end\ of\ third\ cycle} x_n c_{kf} \cos\frac{(2n-1)\pi k_f}{2N} \quad \text{[Expression 14]}$$

Consideration of how to generate local reference waveforms shows that the frequency information obtainable through the discrete cosine transform is equivalent to the total sum of three pieces of local frequency information obtained in the present invention, as shown by Expression 15.

$$X_f = X_f^1 + X_f^2 + X_f^3 \quad \text{[Expression 15]}$$

This shows that these three pieces of local frequency information obtained in the present invention include frequency information having the frequency resolution obtainable through the discrete cosine transform. In other words, this shows that frequency information having a high frequency resolution can be obtained when regarding these three pieces of local frequency information as a combination set.

In addition, Expression 15 shows that there are plural combination sets of the values (Expressions 12, 13 and 14) of local frequency information in the values (Expression 11) of the frequency information obtainable through the discrete cosine transform performed using a desired frequency resolution. For example, there are combination sets of the values shown in Expression 16. More specifically, a conceivable example of a combination of $$(X_f^1, X_f^2, X_f^3)$$

with which $$X_f = 5$$

is obtained is:

$$(X_f^1, X_f^2, X_f^3) = (1,2,2).$$

Other than this, $$(X_f^1, X_f^2, X_f^3) = (2,1,2)$$

and the like are conceivable.

$$(X_f = 5) = (X_f^1 + X_f^2 + X_f^3 = 1+2+2 = 2+1+2 = 1+0+3 = 0+5+0 = 10+(-2)+(-3)) \quad \text{[Expression 16]}$$

This shows: that these three pieces of local frequency information are handled as a batch of data as shown in FIG. 5(*d*) where the frequency information having a desired frequency resolution is discretely represented as the components of the three pieces of local frequency information each having a desired high temporal resolution; and that each local frequency information includes information regarding a change in a temporal frequency structure in addition to the frequency information obtainable through the conventional discrete cosine transform.

Using these three pieces of local frequency information as a batch of data makes it possible to extract frequency feature value, included in an analysis waveform, as if a frequency analysis were performed by setting, in parallel, the high temporal resolution (the length of a time segment to be averaged at the time of obtaining the cross-correlation between an analysis waveform and each reference waveform) and a high frequency resolution. Note that, when extracting frequency feature value, an analysis waveform having a time width corresponding to the 3-cycle cosine waveform is required in order to obtain three pieces of local frequency information independently of a temporal resolution. Therefore, the present invention requires the same time segment width of an analysis waveform necessary for a frequency analysis as the one required in the conventional analysis method.

FIG. 6 is a diagram indicating an example of performing a frequency analysis based on another frequency resolution. In the example of FIG. 6, with a purpose of performing an analysis using a frequency resolution which is higher than the frequency resolution in the example of FIG. 5, as shown in FIG. 6(*a*), 4-cycle cosine waveforms are used as reference waveforms as shown in FIG. 6(*b*).

Here, in the case of performing a frequency analysis using the conventional discrete cosine transform, the temporal resolution (the length of a time segment to be averaged at the time of obtaining the cross-correlation between an analysis waveform and a reference waveform) is the time width of a 4-cycle cosine waveform, and thus the temporal resolution is low. Therefore, it becomes impossible to represent the fine temporal structure of the analysis waveform.

Hence, in the present invention, the analysis waveform is temporally segmented based on a desired temporal resolution. In the example of FIG. 6, two local reference waveforms are generated by segmenting the analysis waveform into 2-cycle cosine waveforms as shown in FIG. 6(*c*). Here, the temporal resolution (the length of a time segment to be averaged at the time of obtaining the cross-correlation between an analysis waveform and each reference waveform) is the time width of each 2-cycle cosine waveform, and a fine setting of the time width is performed independently of the frequency resolution (note that the respective two local reference waveforms are extracted from an identical reference waveform).

Next, two pieces of local frequency information are obtained by performing a frequency analysis using the two local reference waveforms as shown in FIG. 6(*c*). These pieces of local frequency information are obtained by calculating the cross-correlation (convolution) between the analysis waveform and each local reference waveform, using each local reference waveform instead of the reference waveform used in the conventional frequency analysis technique.

Here is considered the relationship between the frequency information in the conventional discrete cosine transform technique and these two pieces of local frequency information in the present invention. The frequency information is obtained using a reference waveform which is a 4-cycle cosine waveform, and the pieces of local frequency information are obtained using the local reference waveforms segmented into the 2-cycle cosine waveform. In the example case of FIG. 6, the frequency information obtainable through the conventional discrete cosine transform technique is represented by Expression 17.

$$X_f = \sum_{n=start}^{end\ of\ fourth\ cycle} x_n c_{kf} \cos\frac{(2n-1)\pi k_f}{2N}$$ [Expression 17]

In addition, these two pieces of local frequency information in the present invention are represented as Expression 18 and Expression 19.

$$X_f^1 = \sum_{n=start}^{end\ of\ second\ cycle} x_n c_{kf} \cos\frac{(2n-1)\pi k_f}{2N}$$ [Expression 18]

$$X_f^2 = \sum_{n=start\ of\ third\ cycle}^{end\ of\ fourth\ cycle} x_n c_{kf} \cos\frac{(2n-1)\pi k_f}{2N}$$ [Expression 19]

Consideration of how to generate local reference waveforms shows that the frequency information obtainable through the discrete cosine transform is equivalent to the total sum of two pieces of local frequency information obtained in the present invention, as shown by Expression 20.

$$X_f = X_f^1 + X_f^2$$ [Expression 20]

This shows that these two pieces of local frequency information obtained in the present invention include frequency information having the frequency resolution obtainable through the discrete cosine transform. In other words, this shows that frequency information having a high frequency resolution can be obtained when regarding these two pieces of local frequency information as a combination set.

In addition, Expression 20 shows that there are plural combination sets of the values (Expressions 18 and 19) of local frequency information in the value (Expression 17) of the frequency information obtainable through the discrete cosine transform performed using a desired frequency resolution. For example, there are combination sets of the values shown in Expression 21. More specifically, a conceivable example of a combination of $$(X_f^1, X_f^2)$$

with which $$X_f = 2$$

is obtained is $$(X_f^1, X_f^2) = (0.9, 1.1).$$

Other than this, $$(X_f^1, X_f^2) = (2.5, (-0.5))$$

and the like are conceivable.

$$(X_f = 2) = (X_f^1 + X_f^2 = 0.9 + 1.1 = 2.5 + (-0.5) = 1.0 + 1.0)$$ [Expression 21]

This shows: that these two pieces of local frequency information are handled as a batch of data as shown in FIG. 6(*d*) where the frequency information having a desired frequency resolution is discretely represented as the components of the two pieces of local frequency information each having a desired high temporal resolution; and that each local frequency information includes information regarding a change in a temporal frequency structure in addition to the frequency information obtainable through the conventional discrete cosine transform.

Using two pieces of local frequency information as a batch of data makes it possible to extract frequency feature value, included in an analysis waveform, as if the frequency analysis were performed by setting, in parallel, a high temporal resolution (the length of a time segment to be averaged at the time of obtaining the cross-correlation between an analysis waveform and each reference waveform) and a high frequency resolution. Note that, when extracting frequency feature value, an analysis waveform having a time width corresponding to the 4-cycle cosine waveform is required in order to obtain two pieces of local frequency information independently of the idea of a temporal resolution. Therefore, the present invention requires the same time segment width of an analysis waveform necessary for a frequency analysis as the one required in the conventional analysis method.

FIG. 7 is a diagram indicating an example of generating local reference waveforms by segmenting a reference waveform so that these local reference waveforms are temporally overlapped with each other. FIG. 7(*a*) is a diagram indicating the frequency resolution in this example, and the frequency resolution is assumed to be the same as that shown in FIG. 6(*a*). In the example case of FIG. 7, the same 4-cycle cosine waveform as that in the example of FIG. 6 is regarded as an analysis waveform as shown in FIG. 7(*b*).

Here, in the case of performing a frequency analysis using the conventional discrete cosine transform technique, the temporal resolution (the length of a time segment to be averaged at the time of obtaining the cross-correlation between an analysis waveform and each reference waveform) is the time width of the 4-cycle cosine waveform, and thus the temporal resolution is low. This makes it impossible to represent a fine temporal structure of the analysis waveform.

Hence, in the present invention, the analysis waveform is temporally segmented based on a desired temporal resolution. In the example of FIG. 7, three local reference waveforms are generated by segmenting the analysis waveform into 2-cycle cosine waveforms as shown in FIG. 7(*c*). Here, the temporal resolution (the length of a time segment to be averaged at the time of obtaining the cross-correlation between an analysis waveform and each reference waveform) is the time width of a 2-cycle cosine waveform (note that the respective three local reference waveforms are extracted from an identical reference waveform).

Next, three pieces of local frequency information are obtained by performing a frequency analysis using the three local reference waveforms as shown in FIG. 7(*c*). These pieces of local frequency information are obtained by calculating the cross-correlation (convolution) between the analysis waveform and each local reference waveform, using each local reference waveform instead of the reference waveform used in the conventional frequency analysis technique.

Here is considered the relationship between the frequency information in the conventional discrete cosine transform technique and these three pieces of local frequency information in the present invention. The frequency information is obtained using a reference waveform which is a 4-cycle cosine waveform, and the pieces of local frequency information are obtained through the segmentation into the 2-cycle cosine waveforms. This consideration shows that a doubled value of the frequency information obtainable through the discrete cosine transform can be approximately obtained as the total sum of the three pieces of local frequency information. In other words, the three pieces of local frequency information include the frequency information obtained by using a high frequency resolution in the discrete cosine transform.

This shows: that these three pieces of local frequency information are handled as a batch of data as shown in FIG. 7(*d*) where the frequency information having a frequency resolution higher than the local frequency information is discretely represented as the components of the three pieces of local frequency information each having a high temporal resolution; and that each local frequency information includes information regarding a change in a temporal frequency structure in addition to the frequency information obtainable through the conventional discrete cosine transform.

Using three pieces of local frequency information as a batch of data makes it possible to extract frequency feature value, included in an analysis waveform, as if the frequency analysis were performed by setting, in parallel, a high temporal resolution and a high frequency resolution. Note that, when extracting frequency feature value, an analysis waveform having a time width corresponding to the 4-cycle cosine waveform is required in order to obtain three pieces of local frequency information independently of the idea of a temporal resolution. Therefore, the present invention requires the same time segment width of an analysis waveform necessary for a frequency analysis as the one required in the conventional analysis method.

FIG. 8 is a diagram indicating an example of performing a frequency analysis based on another temporal resolution. FIG. 8(*a*) is a diagram indicating the frequency resolution in this example, and the frequency resolution is the same as the frequency resolution shown in FIG. 5(*a*). In the example of FIG. 8, a frequency analysis is performed using a temporal resolution (the length of a time segment to be averaged at the time of obtaining the cross-correlation between an analysis waveform and each reference waveform) which is higher than the temporal resolution in the example of FIG. 5. In this example, the same 3-cycle cosine waveform as the example of FIG. 5 is regarded as a reference waveform as shown in FIG. 8(*b*).

Here, in the case of performing a frequency analysis using the conventional discrete cosine transform, the temporal resolution is the time width of a 3-cycle cosine waveform, and thus the temporal resolution is low. Hence, in the example of FIG. 8, six pieces of local reference waveforms are generated by segmenting an analysis waveform into 0.5-cycle cosine waveforms as shown in FIG. 8(*c*). Here, the temporal resolution corresponds to the time width of the 0.5 cosine waveform. Accordingly, six pieces of local frequency information are obtained by performing a frequency analysis using these six local reference waveforms.

Here, consideration of the relationship between the frequency information obtainable through the conventional discrete cosine transform performed using these reference waveforms (3-cycle cosine waveforms) and the six pieces of local frequency information in the present invention shows that the frequency information obtainable through the discrete cosine transform can be obtained as the total sum of the six pieces of local frequency information. In other words, these six pieces of local frequency information include the frequency information obtainable through the discrete cosine transform performed using a predetermined frequency resolution. Accordingly, so that the resulting pieces of local reference waveforms are not temporally overlapped with each other six pieces of local frequency information are handled as a batch of data which discretely represents the frequency information having a frequency resolution higher than the local frequency information as the components of the six pieces of local frequency information each having a high temporal resolution; and that each local frequency information includes information regarding a change in a temporal frequency structure in addition to the frequency information obtainable through the conventional discrete cosine transform.

Using the six pieces of local frequency information as a batch of data as shown in FIG. 8(*d*) makes it possible to extract frequency feature value, included in an analysis waveform, as if the frequency analysis were performed by setting, in parallel, a high temporal resolution and a high frequency resolution. Note that, when extracting frequency feature value, an analysis waveform having a time width corresponding to the 3-cycle cosine waveform is required in order to obtain six pieces of local frequency information independently of a temporal resolution. Therefore, the present invention requires the same time segment width of an analysis waveform necessary for a frequency analysis as the one required in the conventional analysis method.

FIG. 9 is a diagram indicating a relationship between frequency information based on a 1-cycle cosine waveform and frequency information based on the Fourier transform. As shown in FIG. 9(*a*), regarding, as a local reference waveform, a 1-cycle cosine waveform corresponding to a reference frequency, the local frequency information is obtained for each reference frequency (f1, f2, f3 and so on), in the same manner as the example of FIG. 5. When the fundamental frequency is assumed to be f1 as shown in FIG. 9(*c*), the reference frequency is represented as fn. Here, a frequency fn has n-times higher than the frequency f1. Accordingly, as shown in FIG. 9(*b*), frequency information of the Fourier transform can be generated by calculating the total sum of the pieces of local frequency information which fall within a time window in the Fourier transform, in the same manner as the example of FIG. 5. In the example of FIG. 9, the numbers of pieces of local frequency information which fall within the time window in the Fourier transform are: one in the case of local frequency information corresponding to the frequency f1; two in the case of local frequency information corresponding to the frequency f2; and three in the case of local frequency information corresponding to the frequency f3. In the Fourier transform, these reference frequencies satisfy the orthogonal conditions, and thus the waveform information can be easily generated based on the frequency information through the inverse Fourier transform. This shows that the local frequency information in the present invention can be transformed into the waveform information.

With the frequency analysis apparatus of the present invention, it becomes possible to provide a user with a clear extracted audio (waveform information corresponding to the extracted audio) by using, as a batch of data, each piece of local frequency information represented as a high frequency resolution and a high temporal resolution (the length of a time segment to be averaged at the time of obtaining the cross-correlation between an analysis waveform and each reference waveform) when performing a highly accurate extraction of the local frequency information of the audio desired to be extracted from among a mixed audio, for example, in a mixed audio separation system.

Lastly, the points of the present invention is recapped. When a predetermined frequency is subjected to a frequency analysis, in a reference time width (corresponding to the time width of a reference waveform) determined based on a desired frequency resolution, plural reference waveforms (corresponding to local reference waveforms) which have been respectively extracted from an identical reference waveform having the predetermined frequency are prepared so that they fall within the reference time width. Using the plural reference waveforms (corresponding to local reference waveforms), plural pieces of frequency information (corresponding to plural pieces of local frequency information) are generated. Handling these pieces of frequency information as a batch of data, frequency feature value of the analysis waveform is analyzed.

Effects of the Invention

As described above, with the present invention, it becomes possible to provide a mixed audio separation apparatus and a frequency analysis apparatus which are capable of performing a frequency analysis as if the temporal resolution (the length of a time segment to be averaged at the time of obtaining the cross-correlation between an analysis waveform and each reference waveform) and a frequency resolution could be set independently of each other and the frequency analysis were performed by setting, in parallel, a high temporal resolution and a high frequency resolution. The present invention is applicable as a basic technique in a wide variety of fields such as mixed audio separation, voice recognition, audio identification, character recognition, face recognition and iris authentication.

BRIEF DESCRIPTION OF DRAWINGS

FIG. 21 is a diagram for illustrating a local frequency information DB to be generated by the local frequency information generation unit.

FIG. 22 is a diagram indicating an example of a local frequency information DB.

FIG. 23 is a diagram indicating an example of an analysis method of frequency feature values performed using a local frequency information DB.

FIG. 24 is a diagram indicating an example of an analysis method of frequency feature values performed using a local frequency information DB.

FIG. 26 is a diagram indicating an example of a local frequency information DB.

NUMERICAL REFERENCES

- 100 and 100A Mixed audio separation system
- 101 Microphone
- 102 Frequency analysis apparatus
- 103 and 103A Reference waveform's time width determination unit
- 104 Reference waveform segmentation unit
- 105 and 105A Local frequency information generation unit
- 106 and 106A Analysis waveform's frequency feature value extraction unit
- 107 Audio conversion unit
- 108 Speaker
- 1000 Frequency information generation unit
- 1001 Frequency feature value analysis unit
- 1002 Frequency resolution determination unit
- S100 Mixed audio
- S101 Reference waveform
- S102 Local reference waveform
- S103 Local frequency information
- S104 Frequency feature value (Fourier coefficient of an extracted audio)
- S105 Extracted audio
- S1000 Local frequency information DB

BEST MODE FOR CARRYING OUT THE INVENTION

An embodiment of the present invention will be described below with reference to the drawings.

Figure 10:
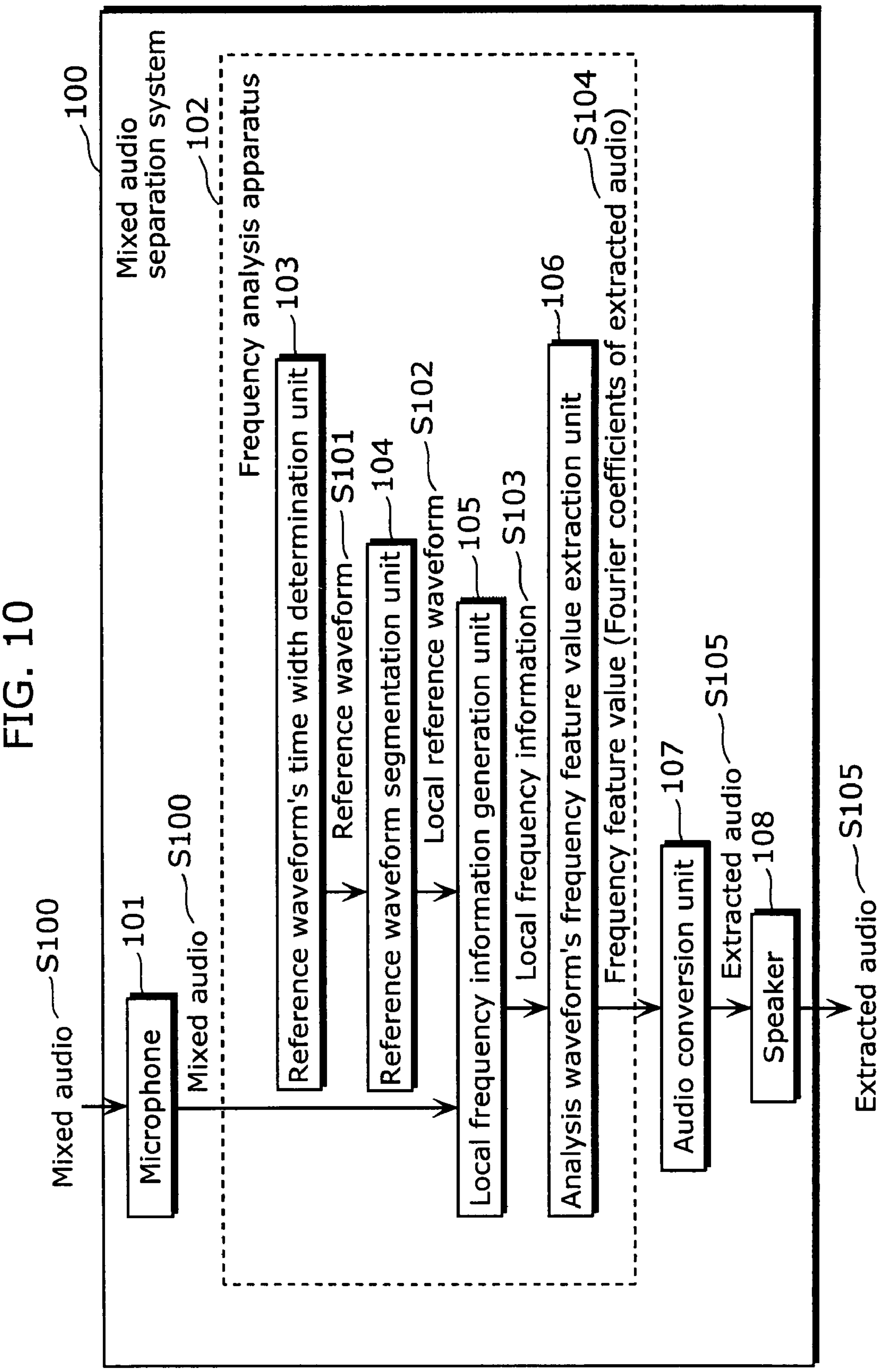
FIG. 10 is a block diagram indicating an overall structure of a frequency analysis apparatus in an embodiment of the present invention.

FIG. 10 is a block diagram indicating an overall structure of a frequency analysis apparatus in an embodiment of the present invention. Here is shown an example where a frequency analysis apparatus of the present invention is incorporated into a mixed audio separation system. In this embodiment, a description is made taking an example case where a mixed audio made up of three speakers' voices is subjected to frequency analysis so as to separate one of the speakers' voices from the mixed audio.

The mixed audio separation system 100 is intended for extracting one of the speakers' voices from a mixed audio containing voices of plural speakers. The mixed audio separation system 100 includes a microphone 101, a frequency analysis apparatus 102, an audio conversion unit 107 and a speaker 108. The frequency analysis apparatus 102 is a processing apparatus which analyzes frequency components included in the mixed audio and extracts frequency feature values. The frequency analysis apparatus 102 includes a reference waveform's time width determination unit 103, a reference waveform segmentation unit 104, a local frequency information generation unit 105 and an analysis waveform's frequency feature value extraction unit 106.

The microphone 101 outputs the mixed audio S100 to the local frequency information generation unit 105.

The reference waveform's time width determination unit 103 determines the time width of a reference waveform corresponding to the reference frequency, based on a predetermined frequency resolution.

The reference waveform segmentation unit 104 segments the reference waveform S101 generated by the reference waveform's time width determination unit 103, based on the predetermined temporal resolution (the length of a time segment to be averaged at the time of obtaining the cross-correlation between an analysis waveform and each reference waveform), so that the segmented reference waveforms S101 are temporally overlapped with each other.

The local frequency information generation unit 105 obtains, using the predetermined temporal resolution, plural pieces of local frequency information S103 corresponding to the local reference waveforms S102 including at least one of an amplification spectrum and a phase spectrum, based on the cross-correlation between the mixed audio S100 and the local reference waveforms S102.

The analysis waveform's frequency feature value extraction unit 106 extract, using the frequency resolution, the local frequency information of the audio to be extracted included in the mixed audio s100 using the plural pieces of local frequency information S103 as a batch of data. The analysis waveform's frequency feature value extraction unit 106 generates the Fourier coefficient S104 of the extracted audio using the local frequency information of the extracted audio so as to extract the Fourier coefficient S104 of the extracted audio. The Fourier coefficient S104 is one of the frequency feature values contained in the mixed audio S100.

The audio conversion unit 107 generates the extracted audio (waveform of the extracted audio) S105 using the Fourier coefficient S104 of the extracted audio. The speaker 108 outputs the extracted audio 105 to a user.

Next, a description is made as to the operation of the mixed audio separation system 100 structured as described above.

Figure 11:
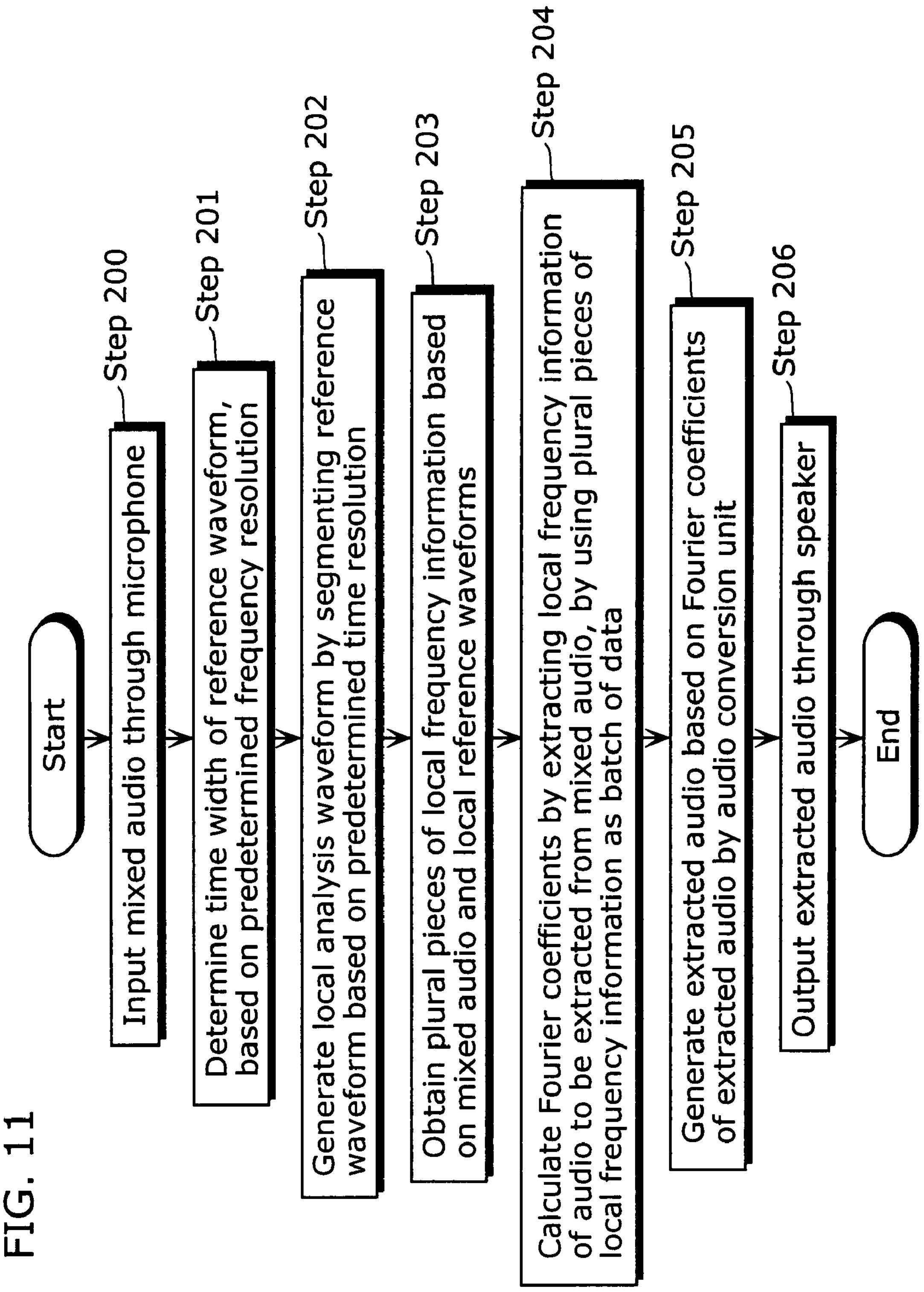
FIG. 11 is a flow chart indicating an operation procedure of a mixed audio separation system 100.

FIG. 11 is a flow chart indicating an operation procedure of the mixed audio separation system 100.

Figure 12:
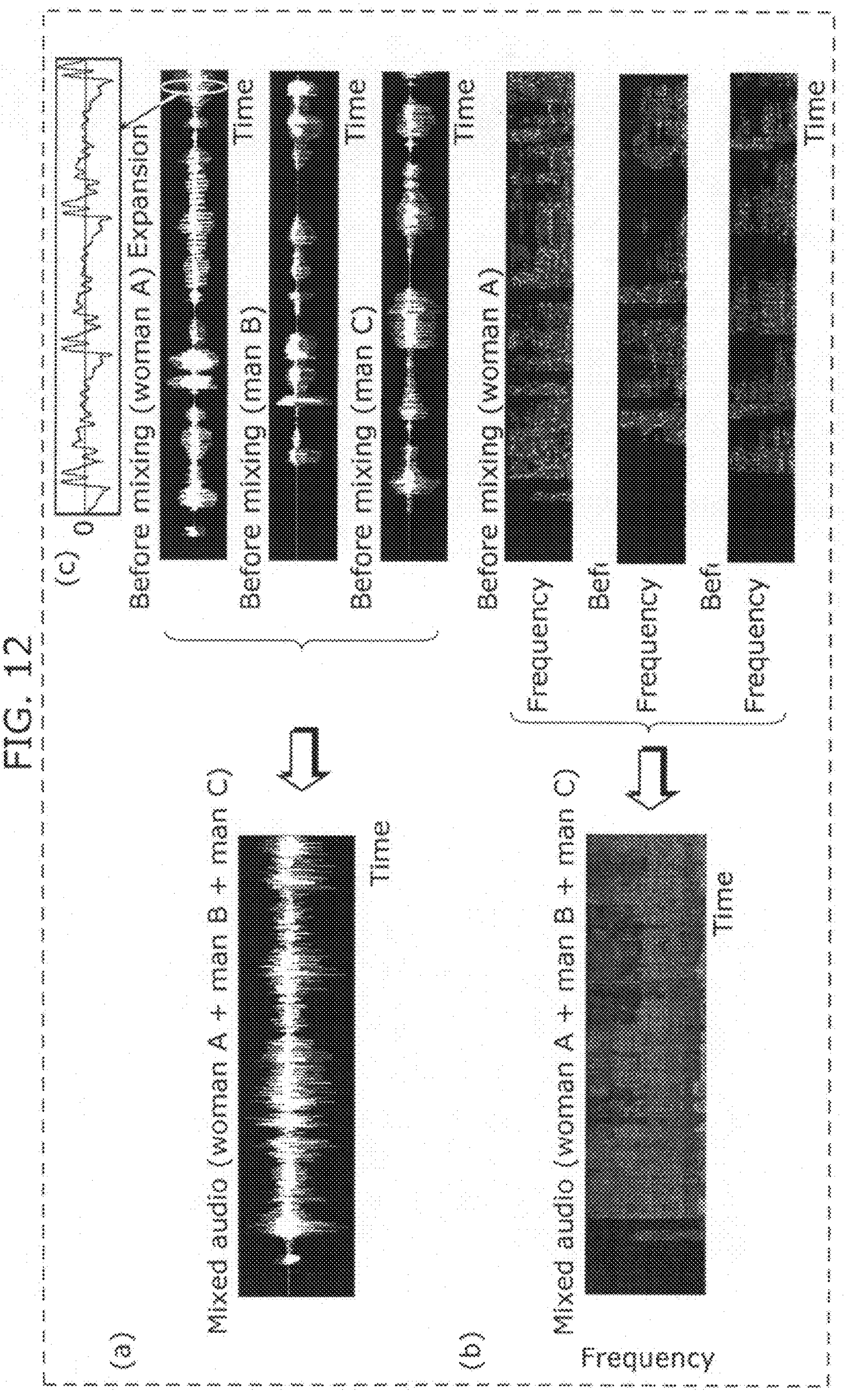
FIG. 12 is a diagram indicating an example of a mixed audio S100.

First, the mixed audio S100 made up of three speakers' voices is inputted through the microphone 101 into the local frequency information generation unit 105 of the frequency analysis apparatus 102 (Step 200 of FIG. 11). FIG. 12 shows an example of the mixed audio S100. FIG. 12(*a*) is the waveform of the mixed audio S100. FIG. 12(*b*) is a spectrogram of the mixed audio S100 obtainable through the conventional Fourier transform. As shown in FIG. 12(*c*), a voice can be represented as repeated basic waveforms. In addition, the amplification of the basic wave is not always great in all the time segments, and the amplification is close to 0 in some of the time segments. Therefore, performing an analysis using a high temporal resolution makes it possible to analyze the features of the basic waveforms of the three speakers' voices in the mixed audio. Note that it is difficult to observe the features of the basic waveforms of the three speakers' voices because a low temporal resolution is displayed in the case of the mixed audio of FIG. 12(*a*). This shows that to use a high temporal resolution is important to separate a voice from a mixed audio. In the spectrogram by the Fourier transform of FIG. 12(*b*), it is impossible to set, in parallel, both a high temporal resolution and a high frequency resolution at the time of the Fourier transform. Therefore, it is difficult to observe the features of the respective spectrum forms of the three speakers' voices in the mixed audio independently of each other. In the Fourier transform, to set a high frequency resolution allows analyzing the time average of formants representing the frequency characteristics of each of the three people's voices. However, this lowers the temporal resolution, which makes it impossible to analyze the value of a formant in a narrow time segment. Therefore, even in the case of a mixed audio including voices which do not overlap with each other in such narrow time-frequency region, it becomes difficult to separate an audio desired to be extracted.

Figure 13:
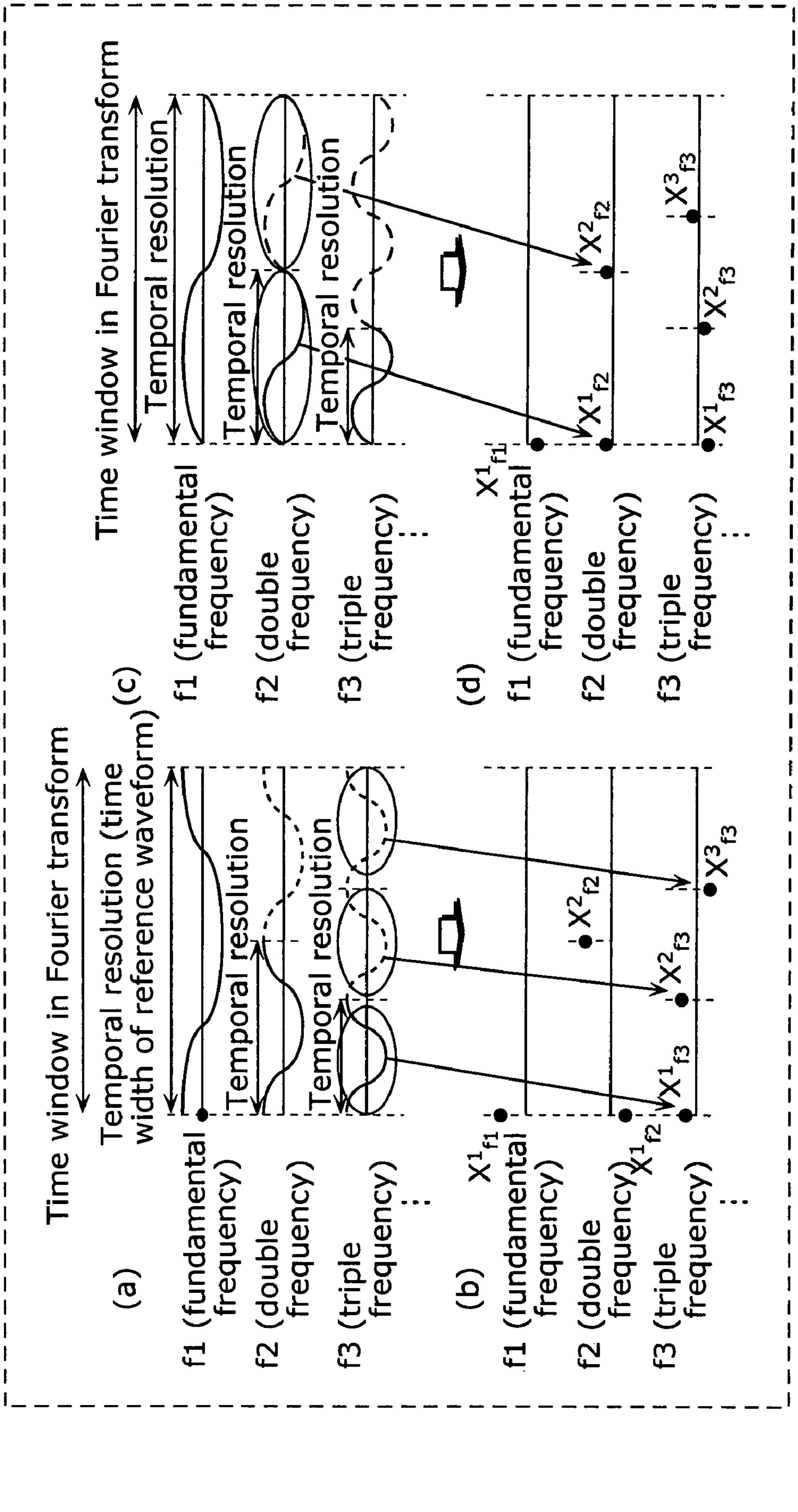
FIG. 13 is a diagram showing reference waveforms and pieces of local frequency information.

Next, the reference waveform's time width determination unit 103 generates a reference waveform S101 by determining the time width of the reference waveform corresponding to the reference frequency, based on a predetermined frequency resolution (Step 201 of FIG. 11). In the example shown in FIG. 13, the time width of the reference waveform S101 is regarded as the time width corresponding to a 1-cycle fundamental frequency f1 (time window in the Fourier transform). 13(*a*) and 13(*b*) in FIG. 13 are diagrams for illustrating frequency analysis by cosine waveforms, and 13(*c*) and 13(*d*) in FIG. 13 are diagrams for illustrating frequency analysis by sine waveforms. In addition, 13(*a*) and 13(*c*) in FIG. 13 show reference waveforms respectively having the reference waveforms, and 13(*b*) and 13(*d*) in FIG. 13 show pieces of local frequency information which respectively correspond to the reference waveforms shown in 13(*a*) and 13(*c*) in FIG. 13.

Figure 9:
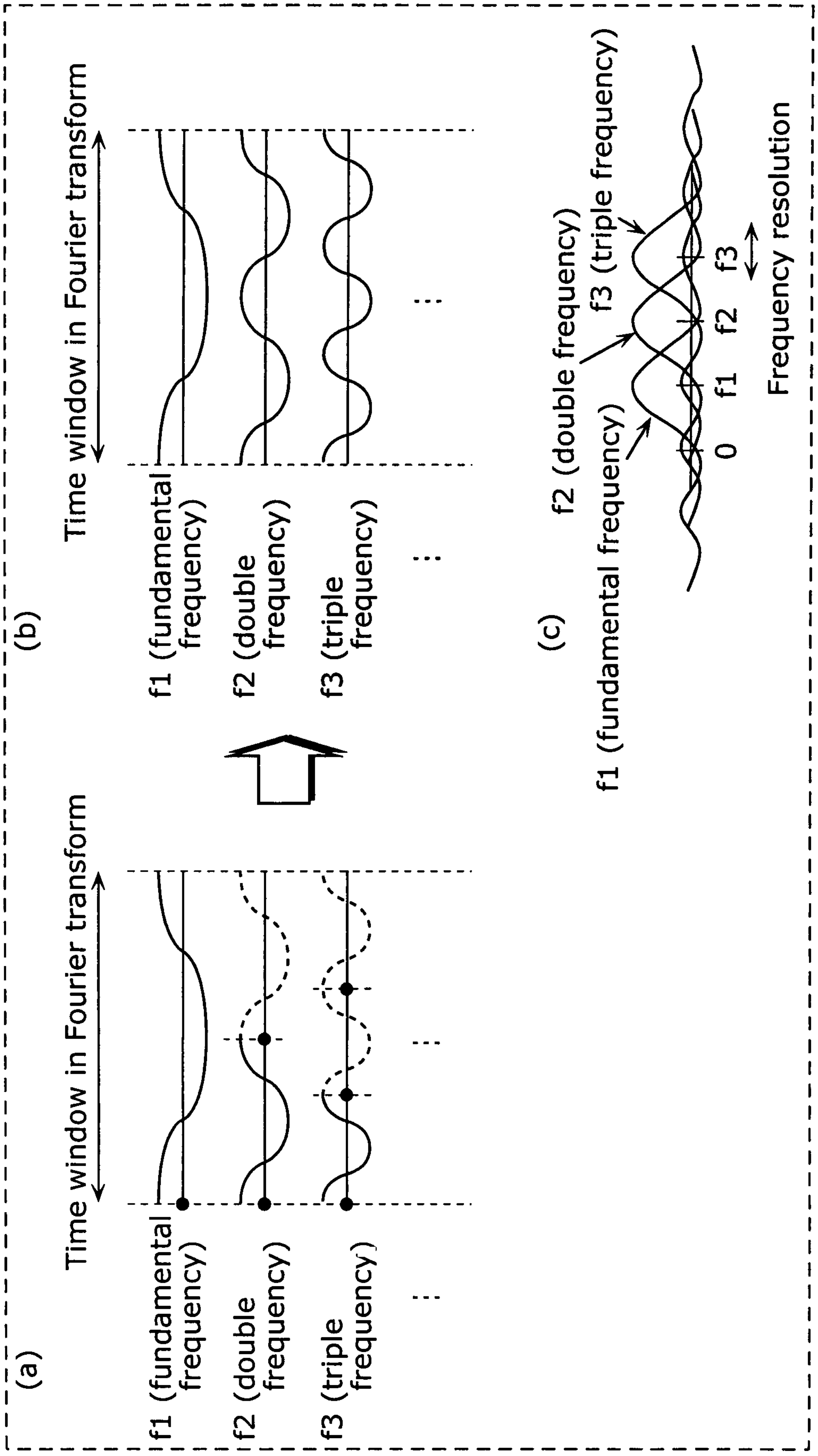
FIG. 9 is a diagram indicating a relationship between frequency information by a 1-cycle cosine waveform and frequency information by the Fourier transform.

The respective reference waveforms shown in 13(*a*) and 13(*c*) in FIG. 13 are waveforms represented by a solid line or a combination of a solid line and a broken line (the waveforms represented by a solid line is a local reference waveform). Here, reference waveforms having the same time width are used with respect to all the reference frequencies. Note that the sizes of the reference frequencies vary, and thus the numbers of cycles contained in the respective reference waveforms vary depending on the reference frequencies. More specifically, as shown in 13(*a*) and 13(*c*) in FIG. 13, the reference waveform having the fundamental frequency f1 as a reference frequency is constituted of a 1-cycle cosine waveform or a sine waveform, the reference waveform having the reference frequency f2, which is double the fundamental frequency f1, as a reference frequency is constituted of 2-cycle cosine waveform or sine waveform, the reference waveform having the reference frequency f3, which is triple the fundamental frequency f1, as a reference frequency is constituted of 3-cycle cosine waveform or sine waveform. The frequency resolution of the reference waveform before being segmented into the local reference waveforms is the same as the one shown in FIG. 9(*c*), and it is such high frequency resolution that makes the frequency characteristics of the reference frequencies f1, f2 and f3 orthogonal to each other.

Note that determining the time width of a reference waveform is equivalent to determining the reference frame width in the short-time Fourier transform. In addition, there is a case where an analysis waveform is multiplied by a window function in the short-time Fourier transform. In an example of this case, multiplying the analysis waveform by the window function is equivalent to multiplying the analysis waveform by a rectangular window having the same time width as that of the reference waveform. Note that frequency analysis may be performed by multiplying the analysis waveform by a window function having a value other than zero within a target segment (time segment where the reference waveform is present).

Note that in the case where the frequency analysis apparatus 102 further includes a frequency resolution input receiving unit, it can determine a frequency resolution based on the nature and application specification of an analysis waveform S100. Such frequency resolution may be inputted from outside. For example, in the case of a spontaneous audio, it is possible to analyze feature values of the spontaneous audio even if the frequency resolution is lowered (in the case of the same temporal resolution, the number of pieces of local frequency information which is to be included in a batch is decreased). In contrast, in the case of a musical sound, there is a need to analyze the feature values of the musical sound by increasing the frequency resolution (in the case of the same temporal resolution, the number of pieces of local frequency information which are to be included in a batch is increased). Calculation amount required in extraction of feature values vary depending on the number of data to be included in a batch. Therefore, to control a reference frequency resolution in accordance with the nature of an inputted analysis waveform makes it possible to reduce the calculation cost.

Figure 1:
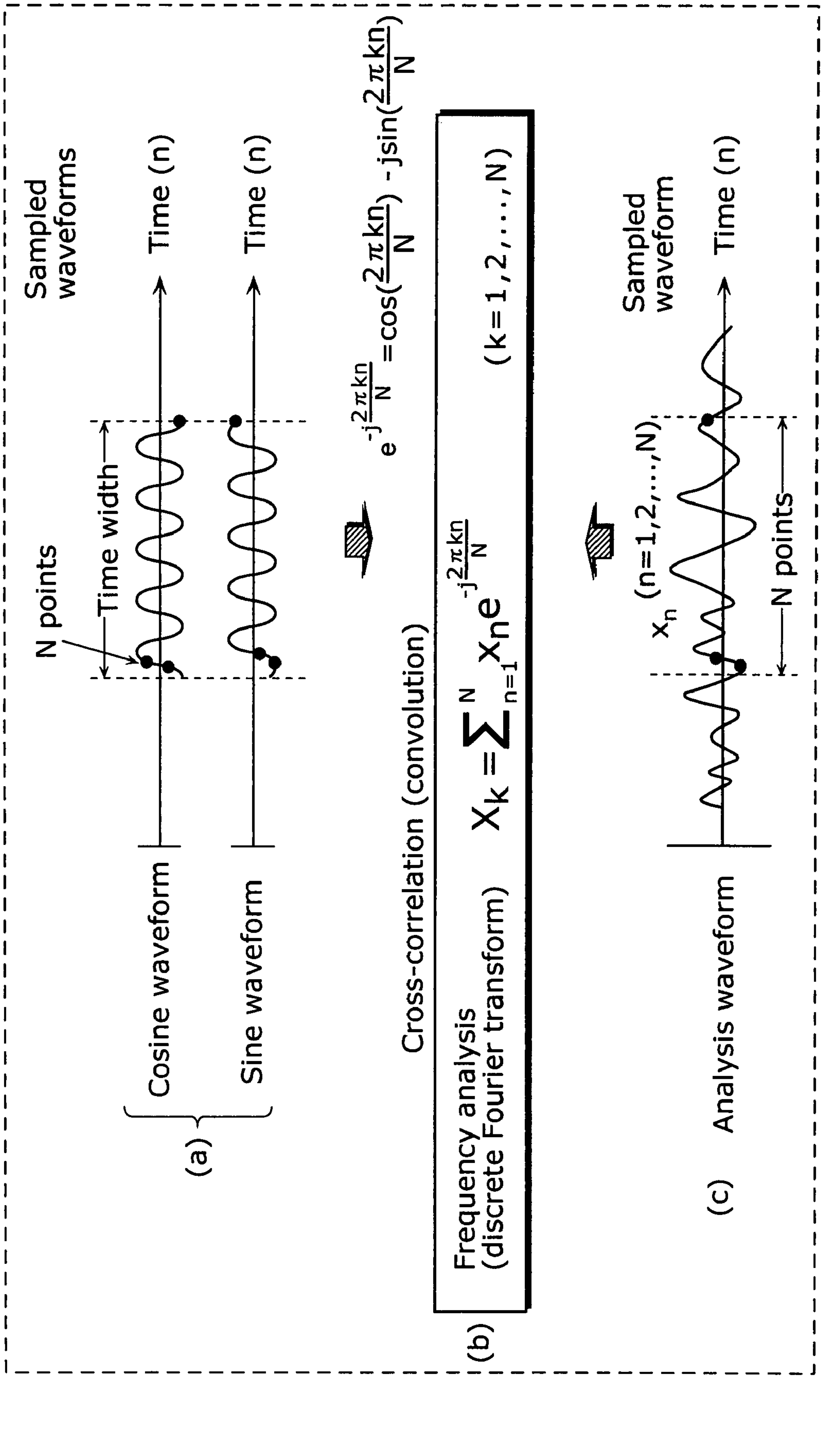
FIG. 1 is a diagram illustrating a method of the Fourier transform (discrete Fourier transform) which is a conventional art.
Figure 2:
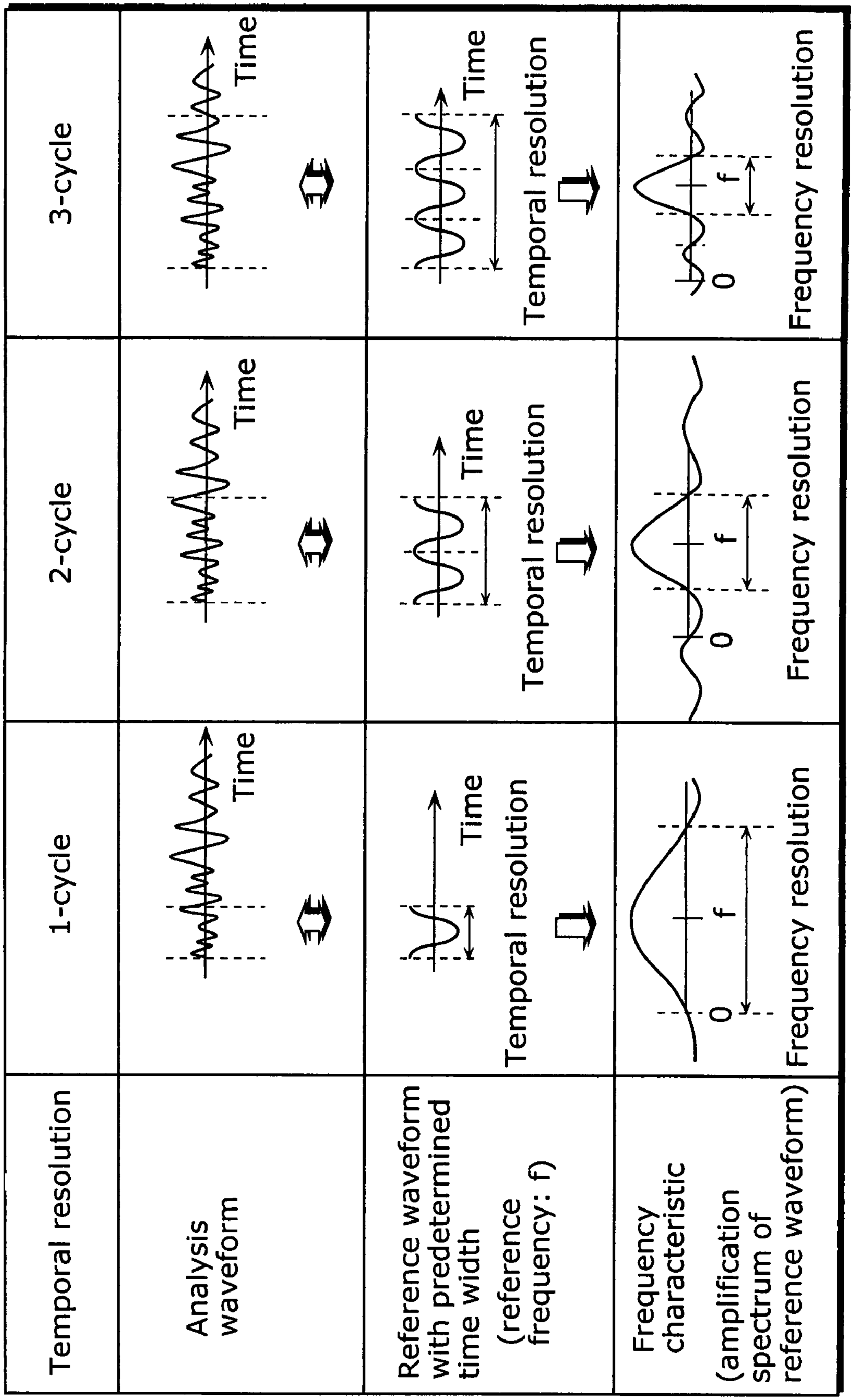
FIG. 2 is a diagram indicating relationships between reference waveforms each having a predetermined time width and frequency characteristics obtained when performing a frequency analysis of an analysis waveform using the reference waveforms.
Figure 3:
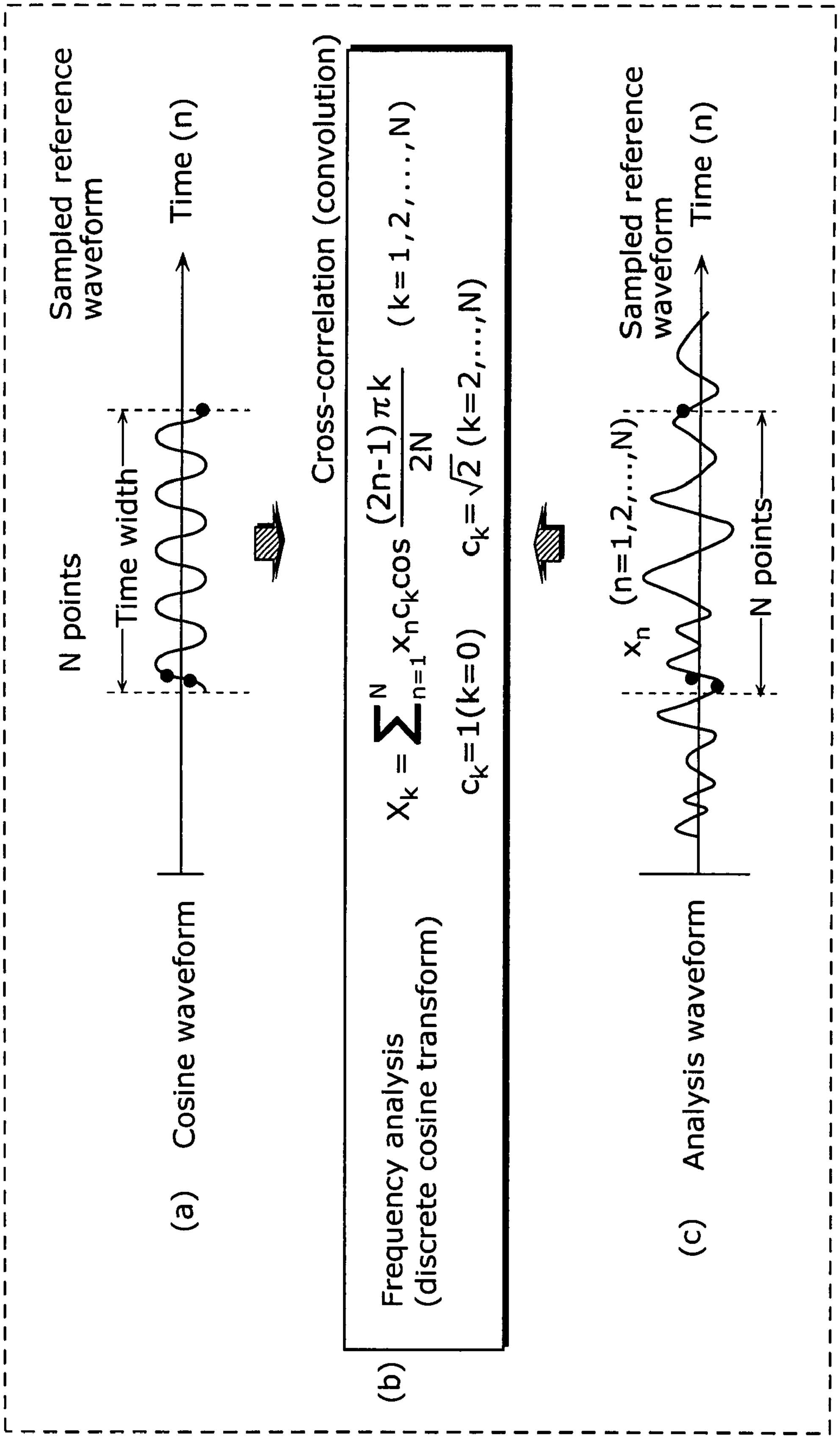
FIG. 3 is a diagram illustrating the cosine transform (discrete cosine transform) which is a conventional art.
Figure 4:
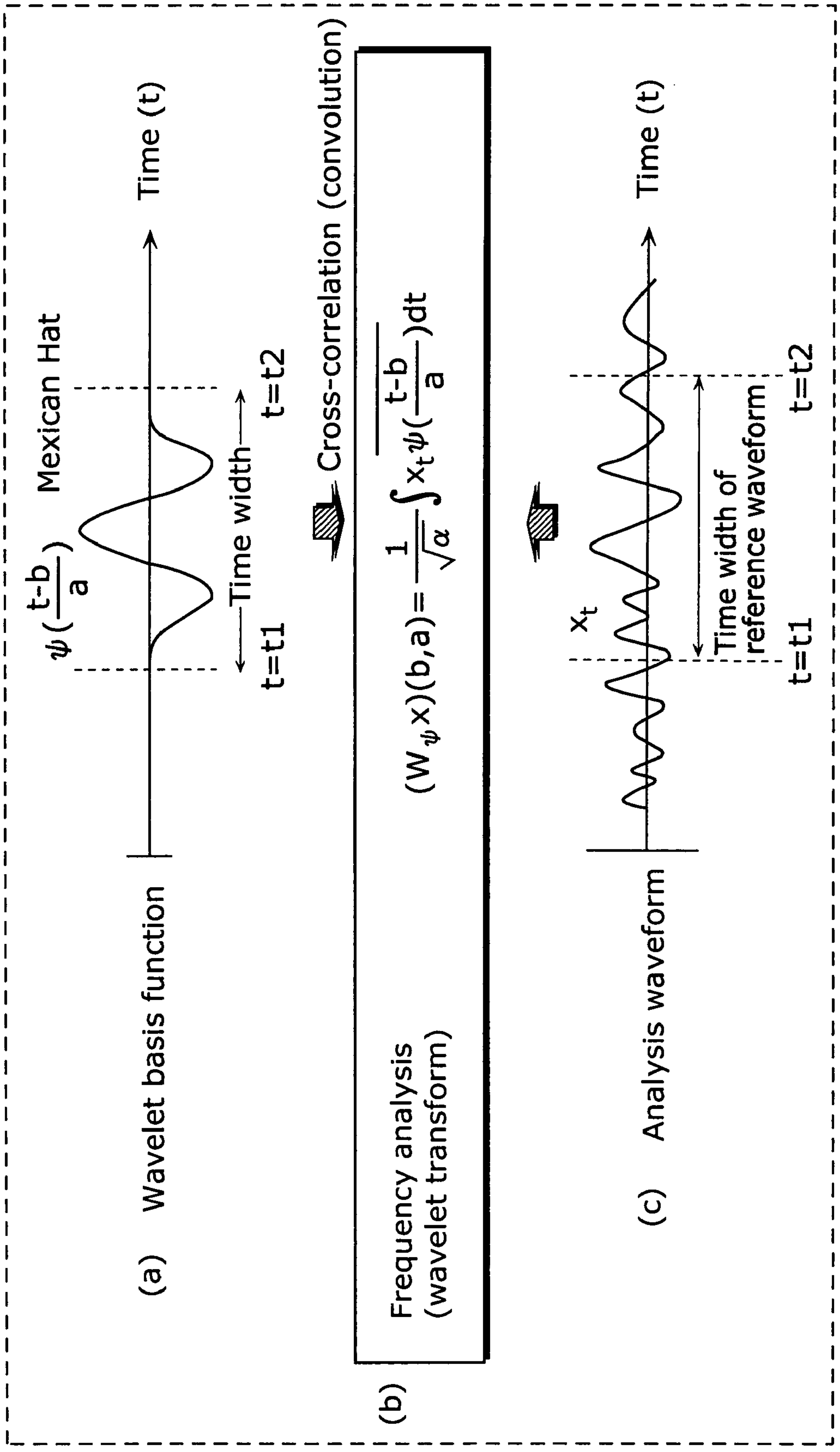
FIG. 4 is a diagram illustrating the wavelet transform which is a conventional art.
Figure 5:
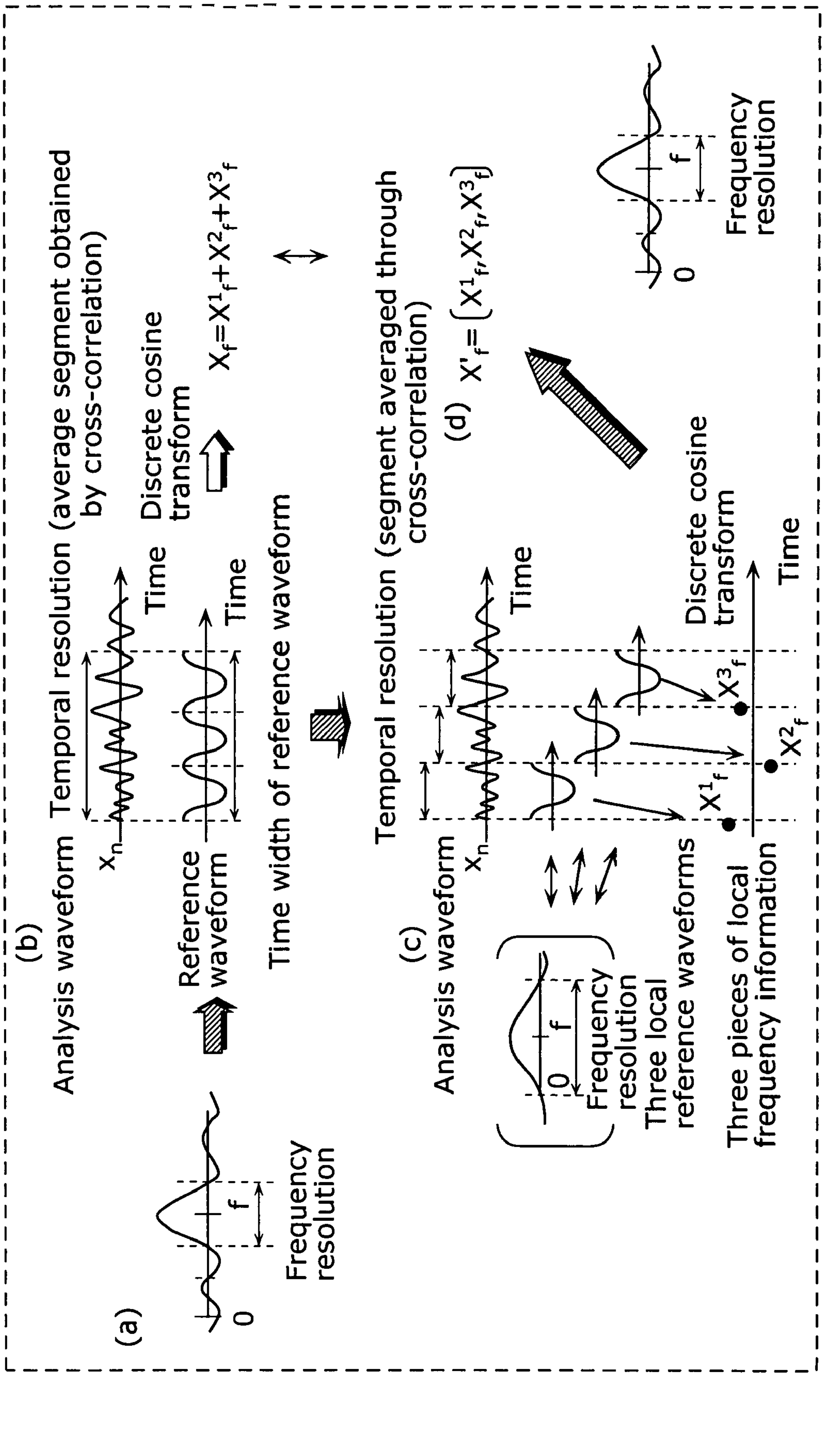
FIG. 5 is a diagram illustrating an overall structure of the present invention.
Figure 6:
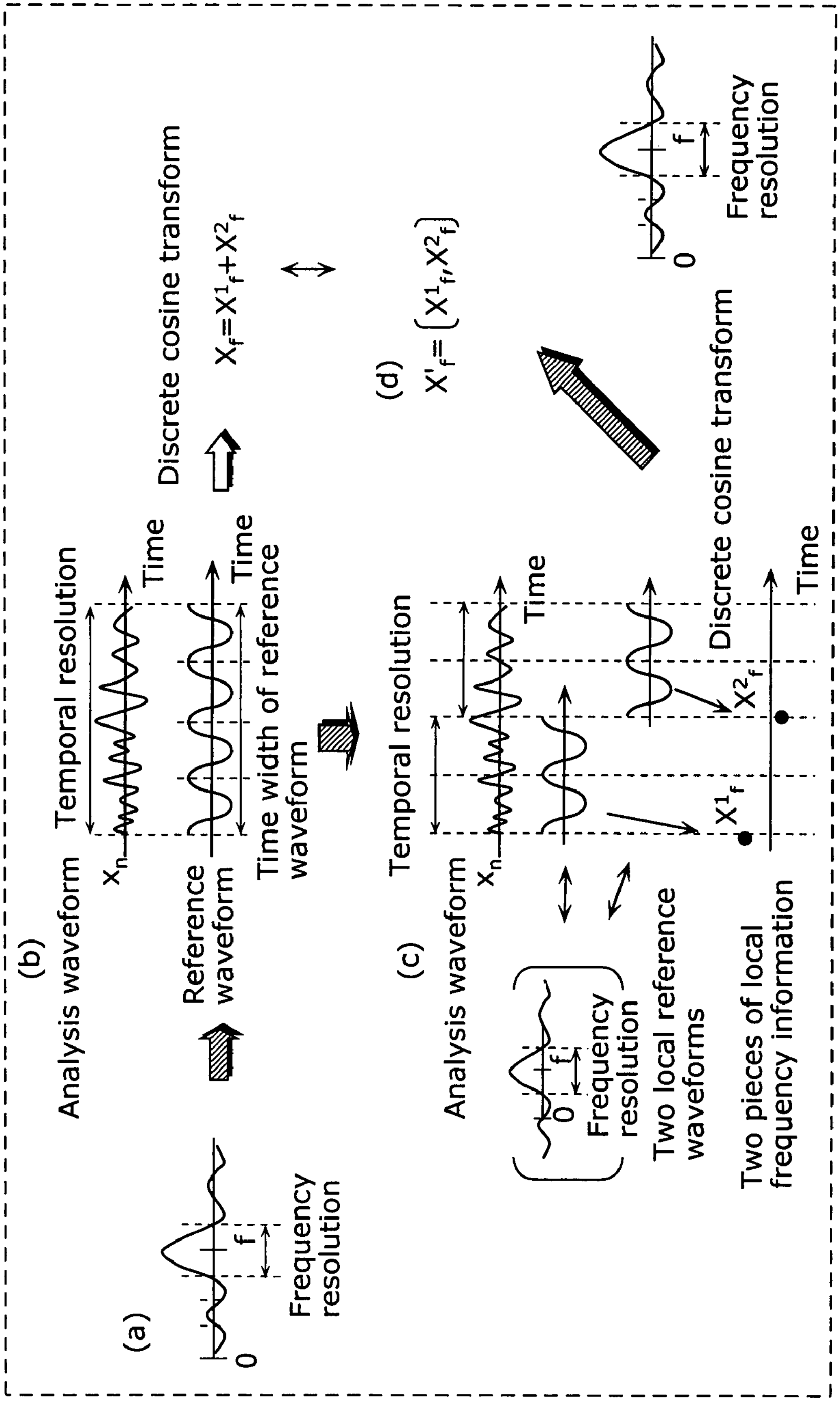
FIG. 6 is a diagram indicating an example of performing a frequency analysis based on another frequency resolution.
Figure 7:
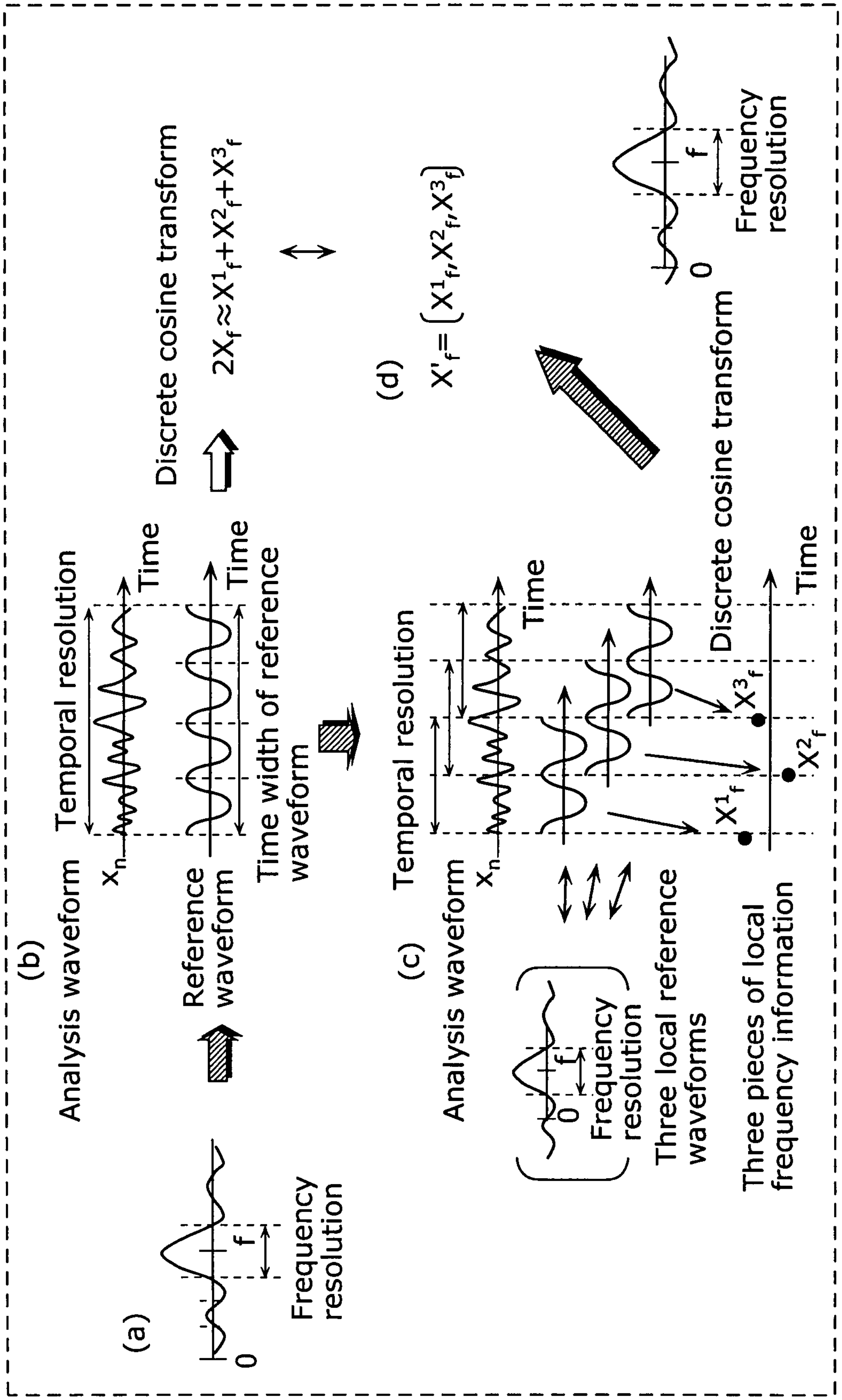
FIG. 7 is a diagram indicating an example of generating local reference waveforms by segmenting a reference waveform so that these local reference waveforms are temporally overlapped with each other.
Figure 8:
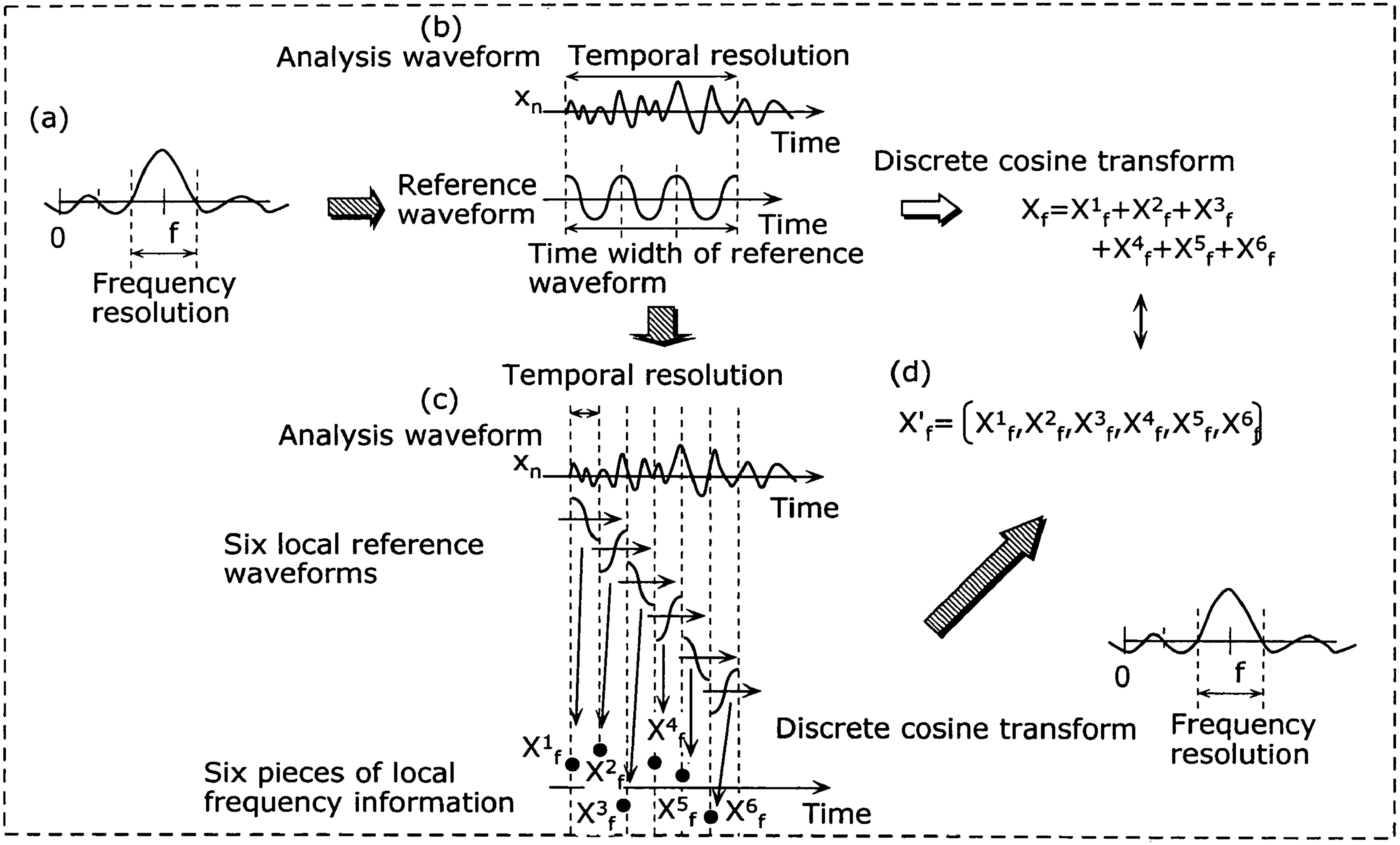
FIG. 8 is a diagram indicating an example of performing a frequency analysis based on another temporal resolution.

Next, the reference waveform segmentation unit 104 generates plural local reference waveforms S102 by segmenting the reference waveform S101 generated by the reference waveform's time width determination unit 103, based on a predetermined temporal resolution, so that these local reference waveforms are temporally overlapped with each other (Step 202 in FIG. 11). In the example shown in FIG. 13, with respect to the reference frequencies, the reference waveforms S101 (the waveforms represented by a solid line or a combination of a solid line and a broken line) are respectively segmented into a 1-cycle cosine waveform or sine waveform so as to generate local reference waveforms S102 (the waveforms represented by a solid waveform is a local reference waveform). 13(*a*) and 13(*b*) of FIG. 13 show the following details. Each of the local reference waveforms having the fundamental frequency f1 as a reference frequency is the reference waveform as it is. Each of the reference waveform having the reference frequency f2, which is double the fundamental frequency f1, as a reference frequency is constituted of two local reference waveforms each including a 1-cycle cosine or sine waveform having the f2 frequency. Each of the reference waveform having the reference frequency f3, which is triple the fundamental frequency f1, as a reference frequency is constituted of three local reference waveforms each including a 1-cycle cosine or sine waveform having the f3 frequency. When these reference frequencies are observed one-by-one, they are similar to the local reference waveforms shown in FIG. 5(*c*). The temporal resolution at this time (the length of a time segment to be averaged at the time of obtaining the cross-correlation between an analysis waveform and each reference waveform) is the time width of the 1-cycle reference waveform having a reference frequency. This shows that the temporal resolution and the frequency resolution can be set independently of each other. Note that the plural pieces of local reference waveforms are respectively extracted from an identical reference waveform. This example shows a case where the reference waveform S101 is segmented so that local reference waveforms are not temporally overlapped with each other. Note that such local reference waveforms may be generated as shown in FIGS. 6, 7 and 8.

In the case where the frequency analysis apparatus 102 further includes a temporal/spatial resolution input receiving unit, it should be noted that it can determine a temporal resolution based on the nature and application specification of an analysis waveform S100. Such temporal resolution may be inputted from outside. For example, in the case of a spontaneous audio, there is a need to perform an analysis using a high temporal resolution. In the case of analyzing a mixed audio which includes a spontaneous audio, a voice, a musical sound and the like appearing alternately, to control the temporal resolution based on the inputted analysis waveform enables a highly accurate analysis and a reduction in a memory capacity for storing these pieces of local frequency information (to lower the temporal resolution when a high temporal resolution is not required allows reducing the number of pieces of local frequency information).

Next, the local frequency information generation unit 105 obtains, plural pieces of local frequency information S103 corresponding to the local reference waveforms S102 including at least one of an amplification spectrum and a phase spectrum, based on the cross-correlation (convolution) between the mixed audio S100 and each local reference waveform S102 and using the predetermined temporal resolution (the length of a time segment to be averaged at the time of obtaining the cross-correlation between an analysis waveform and each reference waveform) (Step 203 in FIG. 11). Here, in an analysis method where the Fourier transform is used, the reference waveform is modified into local reference waveforms so as to obtain pieces of frequency information (refer to Expressions 11, 12, 13 and 14). As shown in the example of FIG. 13, in each of the analyses of cosine waveforms and sine waveforms, a piece of local frequency information is obtained in the case of the fundamental frequency f1 as a reference frequency, two pieces of local frequency information are obtained in the case of the reference frequency f2 as a reference frequency, and three pieces of local frequency information are obtained in the case of the reference frequency f3 as a reference frequency (refer to FIG. 5 also). The use of pieces of local frequency information obtained through the two kinds of frequency analyses of the cosine waveforms and the sine waveforms allows obtaining an amplification spectrum and a phase spectrum. To sum up, the local frequency information in this example includes both of the amplification spectrum and the phase spectrum.

Figure 14:
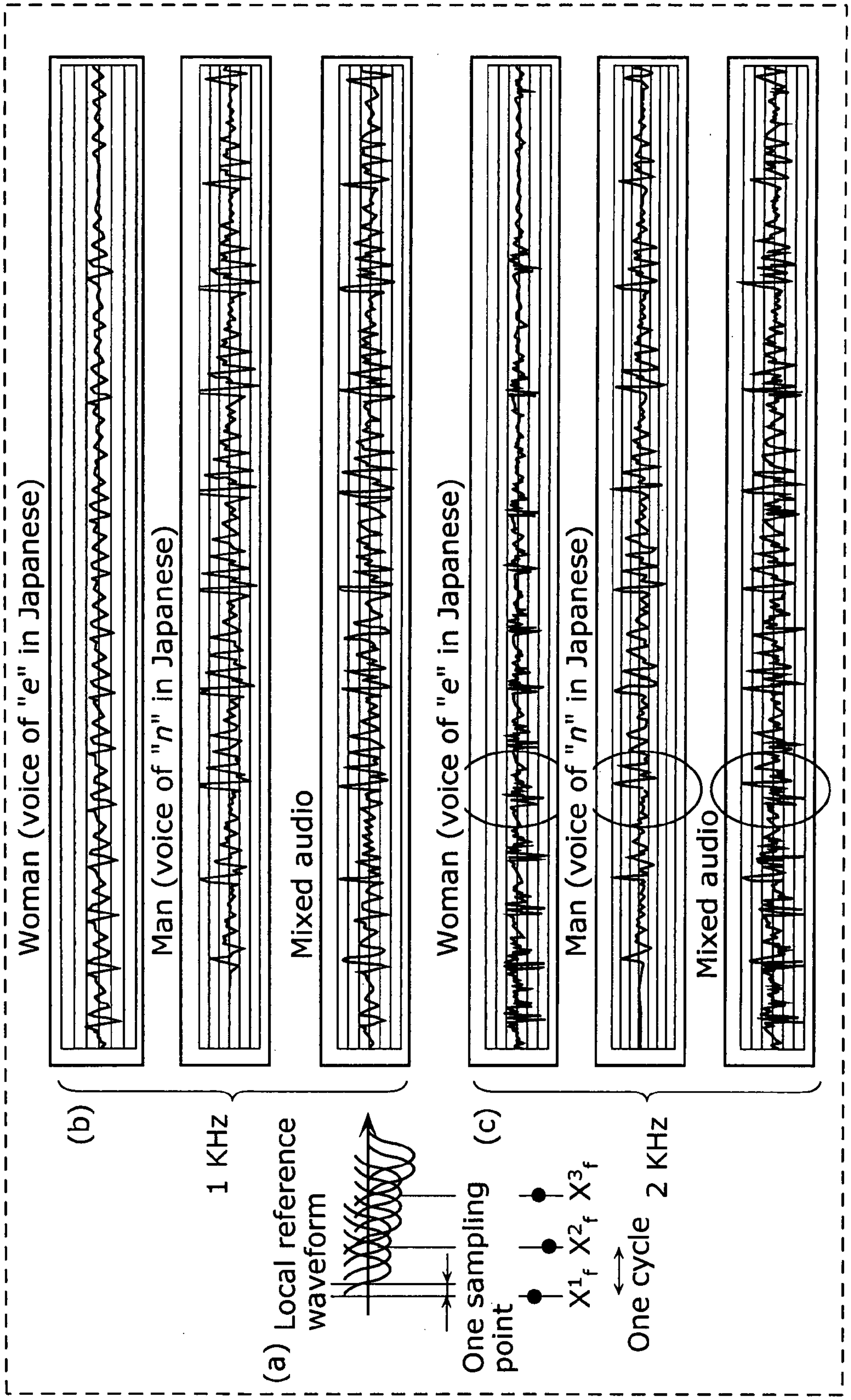
FIG. 14 is a diagram indicating the pieces of local frequency information obtainable through experiment.

FIG. 14 shows pieces of local frequency information of the mixed audio sampled at 16 KHz. FIG. 14(*a*) shows that the same 1-cycle cosine waveform as the one in the example of FIG. 5 is used as a local reference waveform, but unlike the example of FIG. 5, these pieces of local frequency information are obtained at all the sampling points by temporally shifting on a per sampling point basis. FIG. 14(*b*) shows graphs each of which includes pieces of local frequency information of the local frequency at all the sampling points arranged in time-sequence in the case where the reference frequency is 1 KHz. In each graph, the horizontal axis represents time and the vertical axis represents power. FIG. 14(*b*) includes three graphs in the case where an utterance is made in Japanese. Starting with the upper most graph, the piece of local frequency information of a woman's voice of "e" in Japanese, the piece of local frequency information of a man's voice of "n" in Japanese, and the piece of local frequency information of the mixed audio of these are shown in the FIG. 14(*b*).

FIG. 14(*c*) shows graphs each of which includes pieces of local frequency information of the local frequency at all the sampling points arranged in time-sequence in the case where the reference frequency is 2 KHz. The graphs of FIG. 14(*c*) differ only in the reference frequency from the graphs of FIG. 14(*b*).

When pieces of local frequency information are extracted at a time interval corresponding to one cycle of the reference frequencies (1 KHz and 2 KHz) and made into batches of data, the same pieces of local frequency information as those in the example of FIG. 5 can be obtained. In the case of separating an audio of a mixed audio, there is a need to increase both the temporal resolution and the frequency resolution. Since the temporal resolution is increased, it is possible to observe the structure of the woman's voice and the structure of the man's voice within a narrow time segment in the mixed audio as a result of this experiment. In addition, as will be described later, using these pieces of local frequency information as batches of data makes it possible to obtain a result as if the frequency analysis were performed by increasing the frequency resolution. Thus, it is possible to separate a voice, which does not overlap in a narrow time-frequency segment, from a mixed audio.

Figure 15:
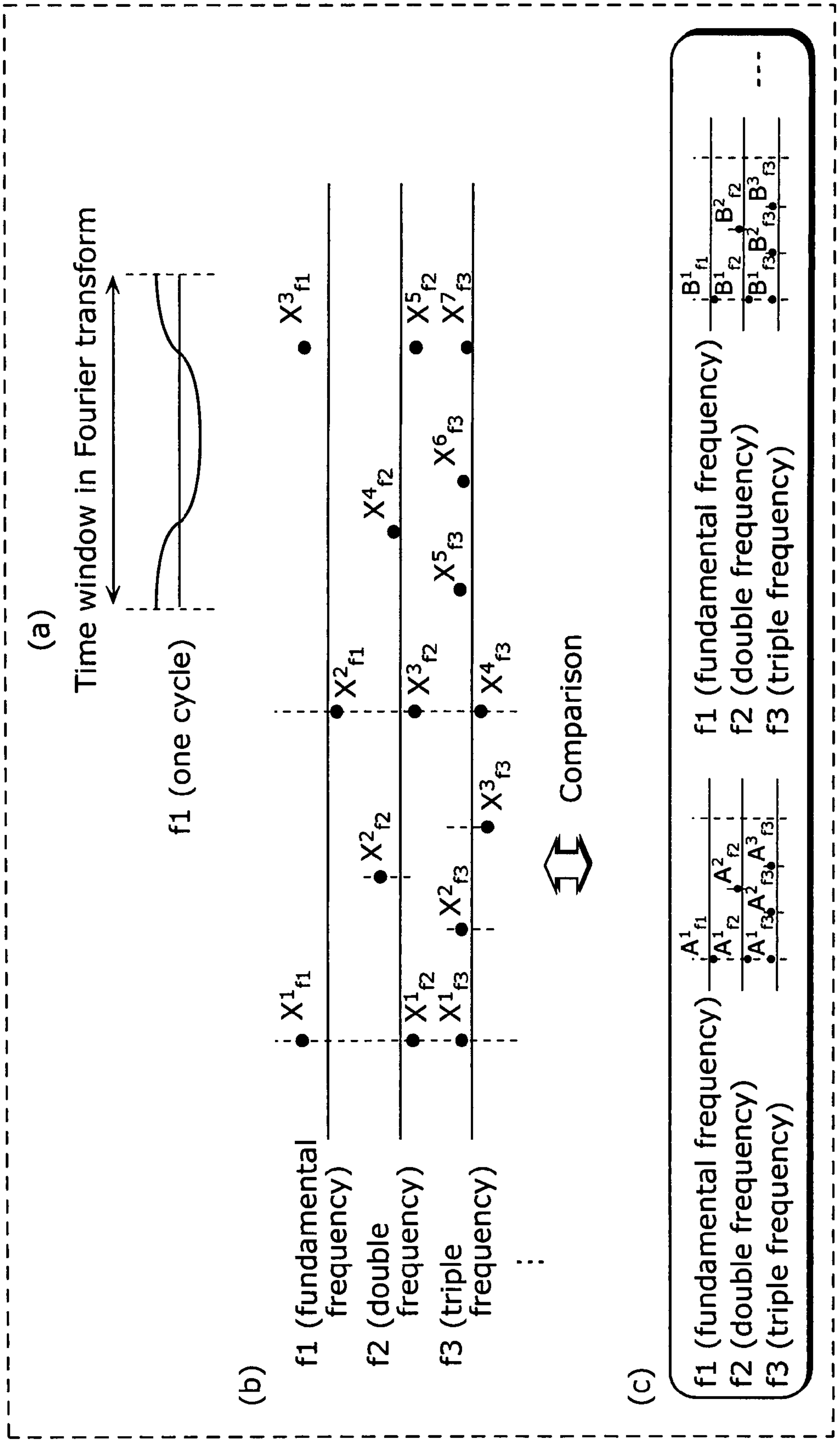
FIG. 15 is a diagram indicating an example of a method for extracting pieces of frequency information of extracted audios included in the mixed audio S100.

Next, the analysis waveform's frequency feature value extraction unit 106 extract, using the frequency resolution, the local frequency information of the audio to be extracted contained in the mixed audio S100 using the plural pieces of local frequency information S103 as a batch of data. The analysis waveform's frequency feature value extraction unit 106 generates the Fourier coefficient S104 of the extracted audio using the local frequency information of the extracted audio so as to extract the Fourier coefficient S104 of the extracted audio (Step 204 in FIG. 11). FIG. 15 shows an example of a method of extracting the local frequency information of the extracted audio included in the mixed audio S100. FIG. 15(*a*) is a diagram showing an example of the local reference waveform S102. FIG. 15(*b*) is a diagram showing the pieces of local frequency information respectively corresponding to the fundamental frequency f1, the double frequency f2 which is double the fundamental frequency f1, and the triple frequency f3 which is triple the fundamental frequency f1. FIG. 15(*c*) is a diagram showing patterns of batches of local frequency information of an audio to be extracted. Here, two patterns of batches of local frequency information are shown with respect to the woman's voice.

In the example of FIG. 15, batches of local frequency information (where pieces of local frequency information included within time windows of the Fourier transform are integrated) of an audio to be extracted are stored in advance as shown in FIG. 15(*c*). The local frequency information of the audio to be extracted included in the mixed audio S100 is extracted by comparing the pieces of local frequency information S103 generated from the mixed audio S100 as shown in FIG. 15(*b*) with the batches of local frequency information of the extracted audio stored as shown in FIG. 15(*c*). In the example of FIG. 15, a woman's voice pattern is stored as described above. In this example, the batch of local frequency information S103 of the mixed audio S100 is compared with the stored batches of local frequency information (woman's voice patterns), and one of the stored voice patterns which provides a minimum error distance (inverse similarity) is selected. In the case where the error distance is not more than a predetermined threshold value, the local frequency information of the mixed audio S100 is extracted. In the other case where the error distance is greater than the threshold value, the local frequency information of the woman's voice to be extracted may be generated (for example, the one shown as Z in the later-described FIG. 18) using the stored voice pattern which provides the minimum error distance. More specifically, the error distance is calculated using Expression 22.

$$E(X, A) = \sqrt{(X_{f1}^1 - A_{f1}^1)^2} + \sqrt{(X_{f2}^1 - A_{f2}^1)^2 + (X_{f2}^2 - A_{f2}^2)^2} + \sqrt{(X_{f3}^1 - A_{f3}^1)^2 + (X_{f3}^2 - A_{f3}^2)^2 + (X_{f3}^3 - A_{f3}^3)^2} \quad \text{[Expression 22]}$$

where X denotes a batch of local frequency information S103 of the mixed audio S100, and A denotes a stored batch of local frequency information (a woman's voice pattern).

When the part of Expression 23 of Expression 22 is considered, all the values of the terms indicated by Expressions 24 to 26 in Expression 23 must be reduced in order to reduce the error distance.

$$\sqrt{(X_{f3}^1 - A_{f3}^1)^2 + (X_{f3}^2 - A_{f3}^2)^2 + (X_{f3}^3 - A_{f3}^3)^2} \quad \text{[Expression 23]}$$

$$(X_{f3}^1 - A_{f3}^1)^2 \quad \text{[Expression 24]}$$

$$(X_{f3}^2 - A_{f3}^2)^2 \quad \text{[Expression 25]}$$

$$(X_{f3}^3 - A_{f3}^3)^2 \quad \text{[Expression 26]}$$

Figure 16:
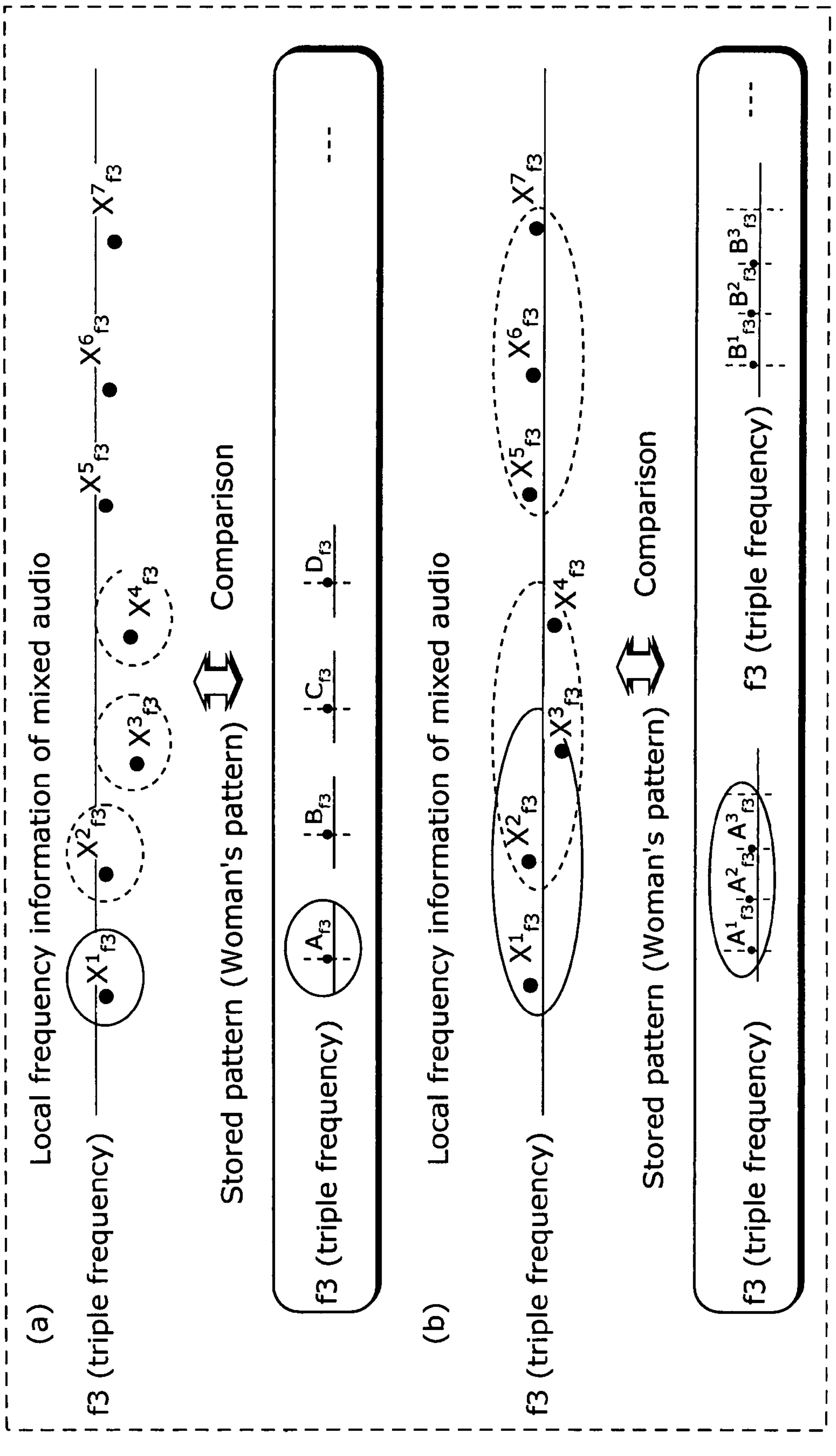
FIG. 16 is a diagram for comparing a conventional method and a method in the present invention in extraction of frequency feature values.

Here, with reference to FIG. 16, the method of the present invention is compared in structure with the conventional method. In the conventional method, the error distance of each piece of local frequency information is calculated so as to select the minimum pattern as shown in FIG. 16(*a*). In contrast, in the present invention, the error distance is calculated using a batch of local frequency information as a pattern so as to select the minimum pattern. Thus the resulting frequency information has a desired frequency resolution obtained by performing in parallel a reduction in the error distance of each piece of local frequency information and generating a batch of plural pieces of local frequency information.

$$X_{f3} = X_{f3}^1 + X_{f3}^2 + X_{f3}^3 \quad \text{[Expression 27]}$$

$$A_{f3} = A_{f3}^1 + A_{f3}^2 + A_{f3}^3 \quad \text{[Expression 28]}$$

As the error distance between Expression 27 and Expression 28, a small pattern is to be selected. On the other hand, in the conventional method shown in FIG. 16(*a*), the error distance provided when using a desired frequency resolution obtained by generating a batch of the pieces of local frequency information is not taken into account.

Figure 17:
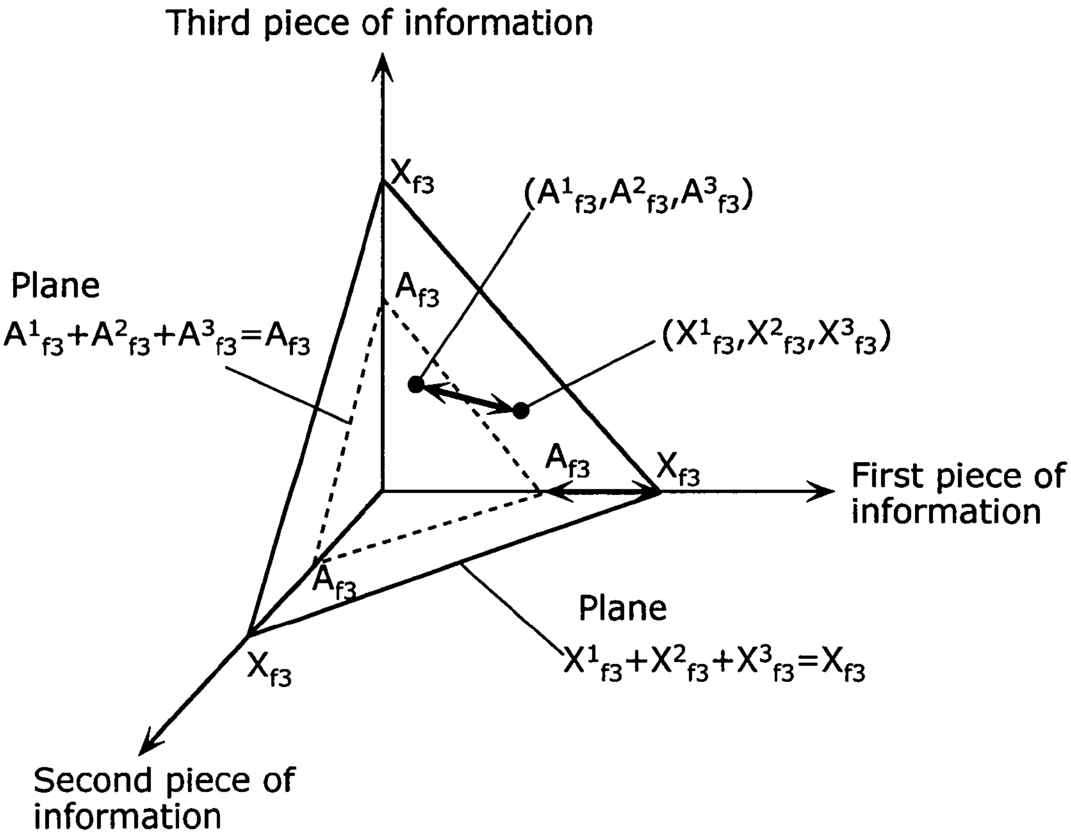
FIG. 17 is a diagram showing a spatial image of local frequency information.

FIG. 17 is a diagram showing a spatial image of pieces of local frequency information. In the example of FIG. 17, each of Expression 27 and Expression 28 represents frequency information with a desired frequency resolution, shows the axes in the plane and the values of the intercepts, and is a batch of local frequency information.

$$(X_{f3}^1, X_{f3}^2, X_{f3}^3) \quad \text{[Expression 29]}$$

$$(A_{f3}^1, A_{f3}^2, A_{f3}^3) \quad \text{[Expression 30]}$$

The Expression 29 shows a point in the plane represented by Expression 27, and the Expression 30 shows a point in the plane represented by Expression 28. In the present invention, frequency feature values are analyzed by: measuring the distance between these planes each having a desired frequency resolution (the distance between the intercepts in FIG. 17), and at the same time considering the distance between the points on these planes representing frequency changes within narrow time segments (the distance between the point shown by Expression 29 and the point shown by Expression 30). The conventional method does not include a concept of measuring the distance between these points on the planes.

Note that the local frequency information of the woman's voice to be extracted may be generated by combining the stored patterns which provide the minimum error distance as shown in FIG. 15(*c*) instead of using the mixed audio, as a generation method of the local frequency information to be extracted.

In the example of FIG. 15, a pattern is generated by generating batches of local frequency information of all the frequencies to be analyzed. However, it should be noted that an error distance may be calculated by storing in advance a woman's voice pattern for each frequency to be analyzed and by using a batch of local frequency information for each frequency to be analyzed.

Note that an error distance may also be calculated by: separately calculating in advance the frequency information using a desired frequency resolution obtained by generating batches of plural pieces of local frequency information; combining the frequency information with the plural pieces of local frequency information, and using, as a positive, the frequency information with the calculated desired frequency resolution.

Note that the similarity may be calculated using the ratios of the respective values of the batches of local frequency information instead of using Expression 22 as an evaluation expression for calculating the error distance.

Figure 18:
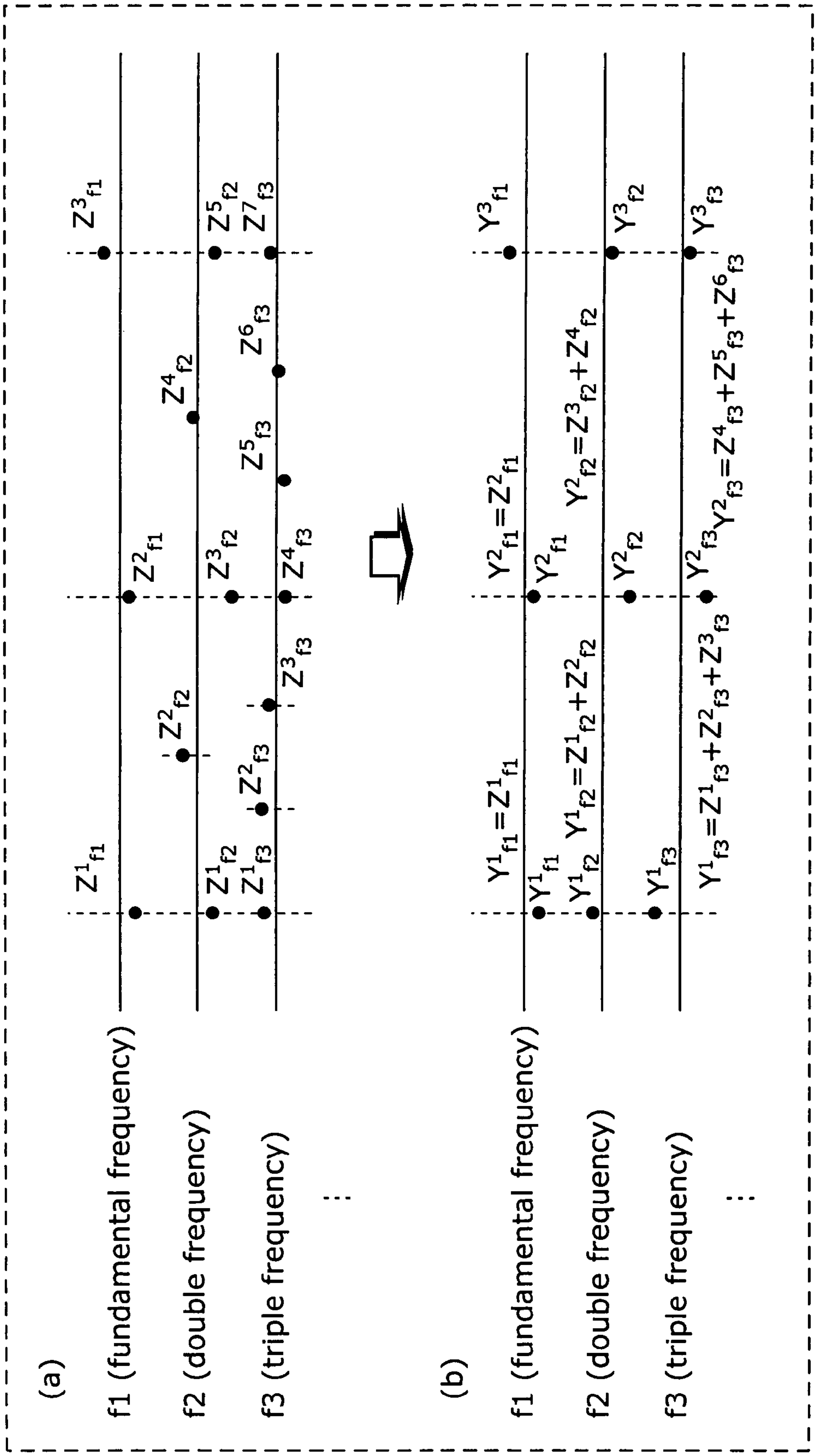
FIG. 18 is a diagram showing an example of local frequency information of the extracted audios included in the mixed audio S100.

Next, as shown in FIG. 18, the Fourier coefficients S104 of an extracted audio is calculated using the local frequency information of the extracted audio. FIG. 18(*a*) shows an example of the local frequency information of the extracted audio included in the mixed audio S100. In this example, the Fourier coefficients (Ys in FIG. 18) as shown in FIG. 18(*b*) are obtained by calculating the total sum of the pieces of local frequency information (Zs in FIG. 18) included within the time windows in the Fourier transform.

Next, the audio conversion unit 107 generates an extracted audio (a waveform of the extracted audio) using the Fourier coefficients S104 of the extracted audio (Step 205 in FIG. 11). In this example, the extracted audio S105 is generated by the inverse Fourier transform.

Lastly, the speaker 108 outputs the extracted audio S105 to a user (Step 206 in FIG. 11).

As described above, with this embodiment of the present invention, a temporal resolution and a frequency resolution can be set independently of each other. Through the comparison between the batches of plural pieces of local frequency information each subjected to a frequency analysis where plural frequency resolutions (plural temporal resolutions) are used, it becomes possible to obtain a result as if the frequency analysis were performed by increasing both the temporal resolutions and the frequency resolutions. This makes it possible to extract a desired audio from among the mixed audio with a high-accuracy.

In this embodiment, the frequency analysis apparatus is incorporated into the mixed audio separation system. However, it should be noted that the frequency analysis apparatus may be incorporated into a voice recognition system, an audio identification system, a character recognition system, a face recognition system and an iris authentication system.

In this embodiment, temporal waveforms are regarded as analysis waveforms. However, it should be noted that spatial waveforms are regarded as analysis waveforms in the case of performing image processing or other cases, and therefore "temporal resolution" corresponds to "spatial resolution". In the DESCRIPTION and the CLAIMS, "temporal resolution" and "spatial resolution" are referred to, in combination, as "temporal/spatial resolution". "spatial resolution" denotes the size of a spatial segment to be averaged at the time of obtaining the cross-correlation (convolution) between an analysis waveform and each reference waveform.

Note that the frequency analysis apparatus 102 of this embodiment can be structured as shown below.

Figure 19:
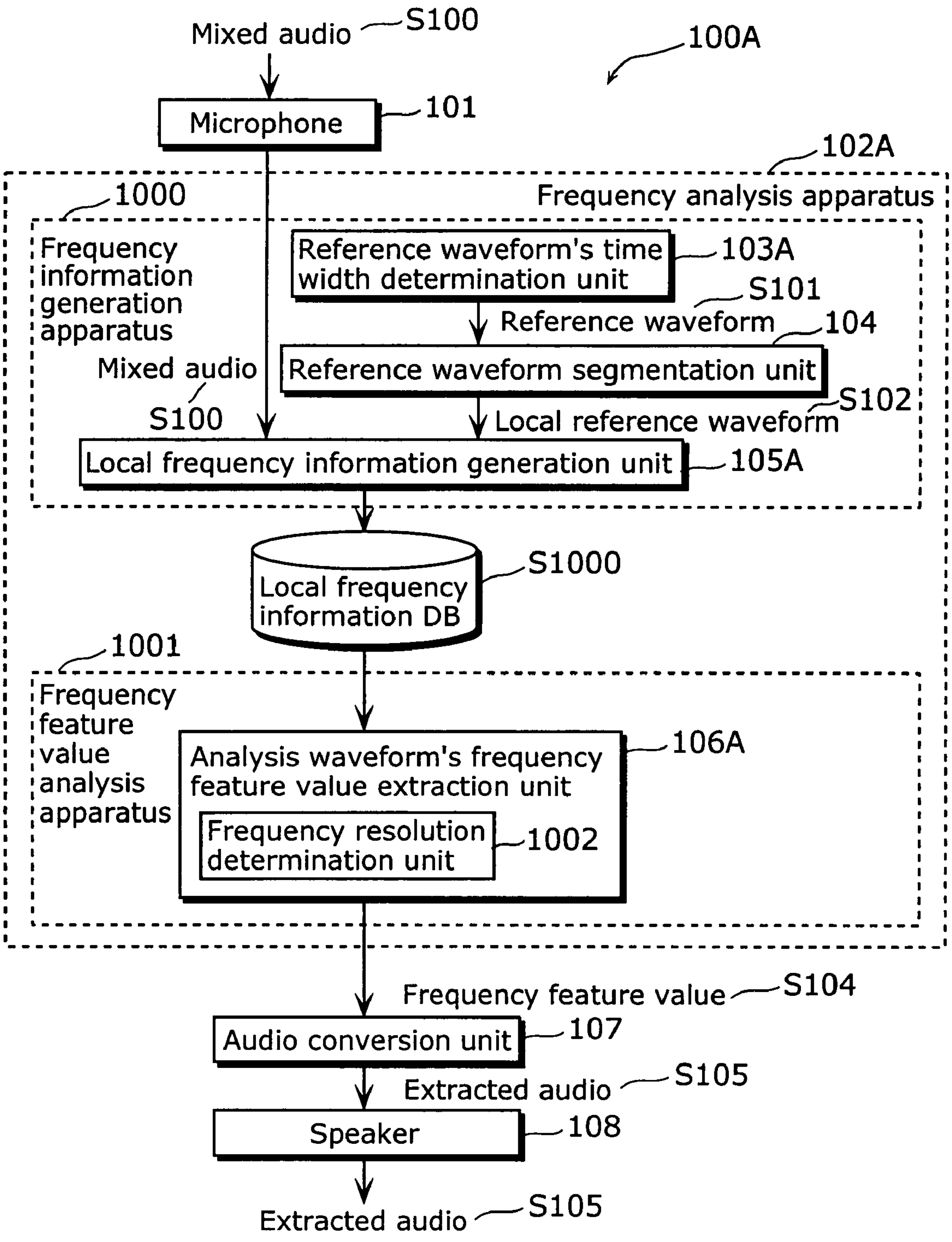
FIG. 19 is a block diagram indicating another example of an overall structure of a frequency analysis apparatus in an embodiment of the present invention.

As shown in FIG. 19, the frequency analysis apparatus 102A can be structured with two apparatuses which are: a frequency information generation apparatus 1000 which generates a local frequency information DB S1000 by generating pieces of local frequency information and gathering them in the local frequency information DB S1000; and a frequency feature value analysis apparatus 1001 which analyzes the frequency feature values S104 using the local frequency information DB S1000 generated by the frequency information generation apparatus 1000.

In the frequency information generation apparatus 1000, the reference waveform's time width determination unit 103A determines the time widths of the respective reference waveforms corresponding to reference frequencies based on the maximum frequency resolution assumed to be used when the frequency feature value analysis apparatus 1001 analyzes the frequency feature values S104, so as to generate reference waveforms S101. In other words, the time widths of the respective reference waveforms, determined by the reference waveform's time width determination unit 103A, determines an upper limit in frequency resolutions with which the frequency feature value analysis apparatus 1001 can analyze the frequency feature values S104.

The actions of the reference waveform segmentation unit 104 are the same as those in FIG. 10, and thus a description of them is omitted.

Next, the local frequency information generation unit 105A obtains plural pieces of local frequency information S103 corresponding to the local reference waveforms S102 including at least one of an amplification spectrum and a phase spectrum, using a predetermined temporal resolution (the length of a time segment to be averaged at the time of obtaining the cross-correlation between an analysis waveform and each reference waveform), based on the cross-correlation (convolution) between the mixed audio S100 inputted through the microphone 101 and the local reference waveforms S102. The local frequency information generation unit 105A generates a local frequency information DB S1000 composed of at least (1) the used reference frequency, (2) information of the shapes of the local reference waveforms, and (3) the time points of the analysis waveform at which pieces of local frequency information S103 and the corresponding pieces of local frequency information have been obtained, and stores the local frequency information DB S1000.

Figure 20:
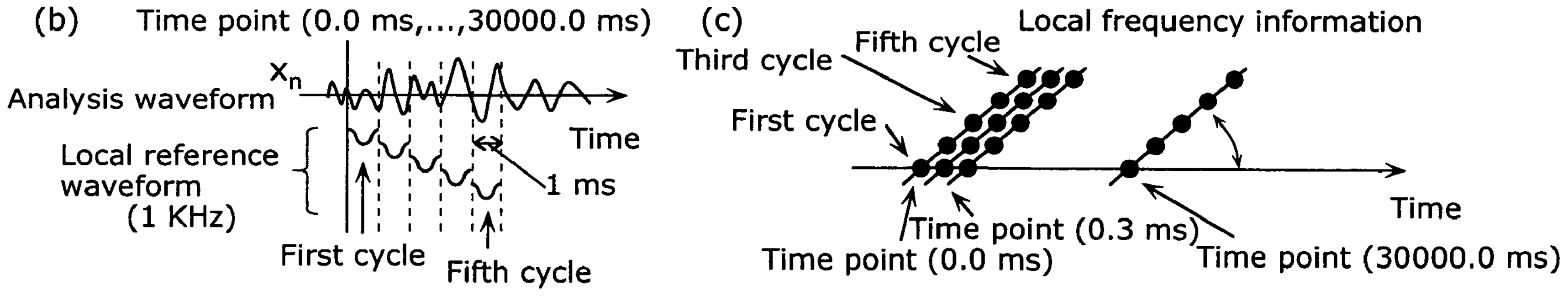
FIG. 20 is a diagram for illustrating a local frequency information DB to be generated by a local frequency information generation unit.

FIG. 20(*a*) shows an example of the local frequency information DB S1000. In this example, the local frequency information DB S1000 is composed of: (1) information indicating that the reference frequency is 1 KHz; (2) information indicating, as the information of the local reference waveforms, that these pieces of local reference waveforms do not overlap with each other, and that the reference waveform constituted of 5-cycle cosine waveform has a temporal resolution of 1 ms (the temporal resolution is the length of a 1-cycle reference frequency 1 KHz; that is, a 1-cycle reference waveform); and (3) the time points of the analysis waveform at which data including a batch of five pieces of local frequency information (values equivalent to the coefficients of the discrete cosine transform in these five pieces of local reference waveforms) and the corresponding pieces of local frequency information have been obtained.

FIGS. 20(*b*) and 20(*c*) show a combination of conceptual renderings for illustration. The conceptual rendering of FIG. 20(*b*) shows that these pieces of local reference waveforms do not overlap with each other. In addition, FIG. 20(*c*) shows that plural batches of five pieces of local frequency information are obtained by temporally shifting the analysis waveform. This time-shifting interval (0.3 ms) can be set independently of the time interval (1 ms) between the five pieces of local reference waveforms used for obtaining the batches of the five pieces of local frequency information.

In the example of FIG. 20, the frequency resolution obtained when making these five pieces of local frequency information into a batch is the maximum frequency resolution that the frequency feature value analysis apparatus 1001 can analyze.

In addition, FIG. 21(*a*) shows another example of the local frequency information DB S1000. This example shows an example of the local frequency information DB obtained based on the pieces of local reference waveforms having plural temporal resolutions. The local frequency information DB S1000 is composed of the followings: (1) Information indicating that the reference frequency is 2 KHz; (2) Information indicating, as the information of the local reference waveforms, that these pieces of local reference waveforms do not overlap with each other, and that the temporal resolution of the 4-cycle cosine waveform which constitutes the reference waveform are: 0.5 ms in the local reference waveform corresponding to the first cycle of the reference waveform; 0.5 ms in the local reference waveform corresponding to the second cycle of the reference waveform; and 1.0 ms in the respective local reference waveforms corresponding to the third and fourth cycles of the reference waveform; and (3) The time points of the analysis waveform at which data including a batch of three pieces of local frequency information (values equivalent to the coefficients of the discrete cosine transform in these three pieces of local reference waveforms) and the corresponding pieces of local frequency information have been obtained.

FIGS. 21(*b*) and 21(*c*) show a combination of conceptual renderings for illustration. The conceptual rendering of FIG. 21(*b*) shows that these pieces of local reference waveforms do not overlap with each other. In addition, FIG. 21(*c*) shows that plural batches of three pieces of local frequency information are obtained by temporally shifting the analysis waveform. This time-shifting interval (0.3 ms) can be set independently of the time interval (0.5 ms, 0.5 ms and 1 ms) between the three pieces of local reference waveforms used for obtaining the batches of the three pieces of local frequency information.

In the example, the frequency resolution obtained when generating a batch of these three pieces of local frequency information is the maximum frequency resolution that the frequency feature value analysis apparatus 1001 can analyze.

In addition, FIG. 22 shows another example of the local reference information DB S1000. In this example, the frequency information (refer to Expressions 11, 12, 13, 14 and 15) which is the total sum of the values of plural pieces of local reference information to be made into a batch is gathered in the local reference information DB S1000, separately from the local frequency information.

In this way, the local frequency information DB S1000 is generated and stored.

As shown in FIG. 19, in the frequency feature value analysis apparatus 1001, the analysis waveform's frequency feature value extraction unit 106A includes a frequency resolution determination unit 1002. The analysis waveform's frequency feature value extraction unit 106A inputs the local reference information DB S1000, and based on the frequency resolution determined by the frequency resolution determination unit 1002, determines the number of pieces of local frequency information to be handled as a batch of data from among (3) the time points of the analysis waveform at which pieces of local frequencies and the corresponding pieces of local frequency information have been obtained.

Note that the local frequency information DB S1000 may be received using a communication path or obtained through a recording medium such as a memory card.

Note that the frequency resolution determination unit 1002 may not be necessary in the case of using all the pieces of local frequency information stored by the local frequency information DB S1000.

FIG. 23 shows an example of an analysis method of frequency feature value in which the local frequency information DB S1000 is used. In this example, the frequency feature value is analyzed using, as a batch of data, the whole (five pieces) local frequency information enclosed by each of the circles in the figure. A specific description is omitted as to the analysis method of the frequency feature value where each batch of the local frequency information is used because the analysis is performed using the same method as the method used by the analysis waveform's frequency feature value extraction unit 106 of FIG. 10. Note that the frequency resolution determination unit 1002 may not be necessary in the example of this case.

In addition, FIG. 24 shows another example of an analysis method of the frequency feature value using the local frequency information DB S1000. In this example, the relationship between the number of pieces of local frequency information to be made into a batch and the frequency resolutions of the pieces of local frequency information is calculated based on the reference frequency 1 KHz and the temporal resolution 1 ms which are stored in the local frequency information DB S1000. The frequency feature value is analyzed, based on the frequency resolutions determined by the frequency resolution determination unit 1002 and using the three pieces of local frequency information enclosed by each of the circles in the figure. A specific description is omitted as to the analysis method of the frequency feature value where each batch of the local frequency information is used because the analysis is performed using the same method as the method used by the analysis waveform's frequency feature value extraction unit 106 of FIG. 10. As shown in the example of FIG. 24, the use of a part of the pieces of local frequency information stored in the local frequency information DB makes it possible to analyze the frequency feature value using a desired frequency resolution.

In the example of FIG. 24, the time-shifting interval is determined as 0.3 ms by setting time point 0.0 ms, time point 0.3 ms and time point 0.6 ms. However, it should be noted that the frequency feature value may be analyzed at a time-shifting interval of 0.6 ms by using a batch of pieces of local frequency information at time point 0.0 ms, time point 0.6 ms and time point 1.2 ms. At this time, the frequency feature value is to be analyzed using a part of the pieces of local frequency information in the local frequency information DB S1000.

In addition, in the case of analyzing a frequency feature value using the local frequency information DB S1000 as shown in FIG. 22, the error distance is calculated using "frequency information", of the local reference information DB S1000 of FIG. 22, which is obtained from Expression 31 shown below and is the frequency information having a desired frequency resolution in the case where plural pieces of local reference information are made into a batch, instead of using the error function of Expression 22.

$$E(X, A) = \sqrt{(X_{f1}^1 - A_{f1}^1)^2} + \sqrt{(X_{f2}^1 - A_{f2}^1)^2 + (X_{f2}^2 - A_{f2}^2)^2} + \sqrt{(X_{f3}^1 - A_{f3}^1)^2 + (X_{f3}^2 - A_{f3}^2)^2 + (X_{f3}^3 - A_{f3}^3)^2} + w \times \left( \sqrt{(X_{f1} - A_{f1})^2} + \sqrt{(X_{f2} - A_{f2})^2} + \sqrt{(X_{f3} - A_{f3})^2} \right)$$ [Expression 31]

$$X_{f1}, X_{f2}, X_{f3}$$ [Expression 32]

where Expression 32 is "frequency information" of local frequency information DB S1000, $$A_{f1}, A_{f2}, A_{f3}$$ [Expression 33]

Expression 33 corresponds to the stored "local frequency information" (woman's voice pattern) and $$w$$ [Expression 34]

is a weight coefficient.

Note that in the examples of FIG. 23 and FIG. 24, the error distance may be calculated using the error function of Expression 31 with which "frequency information" is calculated by obtaining the total sum of the values of pieces of local frequency information.

The actions of the audio conversion unit 107 and the speaker 108 are the same as those of FIG. 10, and thus descriptions of them are omitted.

Lastly, the user can listen to the extracted audio S105 through the speaker 108.

Here are shown other examples of the local frequency information generation unit 105A, the local frequency information DB S1000 and the analysis frequency feature value extraction unit 106A.

Based on the cross-correlation (convolution) between the mixed audio S100 and the local reference waveform S102, the local frequency information generation unit 105A obtains plural pieces of local frequency information S103 corresponding to the local reference waveforms S102 including at least one of an amplification spectrum and a phase spectrum, using a predetermined temporal resolution (the length of a time segment to be averaged at the time of obtaining the cross-correlation between an analysis waveform and each reference waveform), based on the cross-correlation (convolution) between the mixed audio S100 and the local reference waveforms S102. The local frequency information generation unit 105A generates a local frequency information DB S1000 composed of (1) the used reference frequency, (2) information of the shapes of the local reference waveforms, and (3) the time points of the analysis waveform at which pieces of local frequency information S103 and the corresponding pieces of local frequency information have been obtained.

Figure 25:
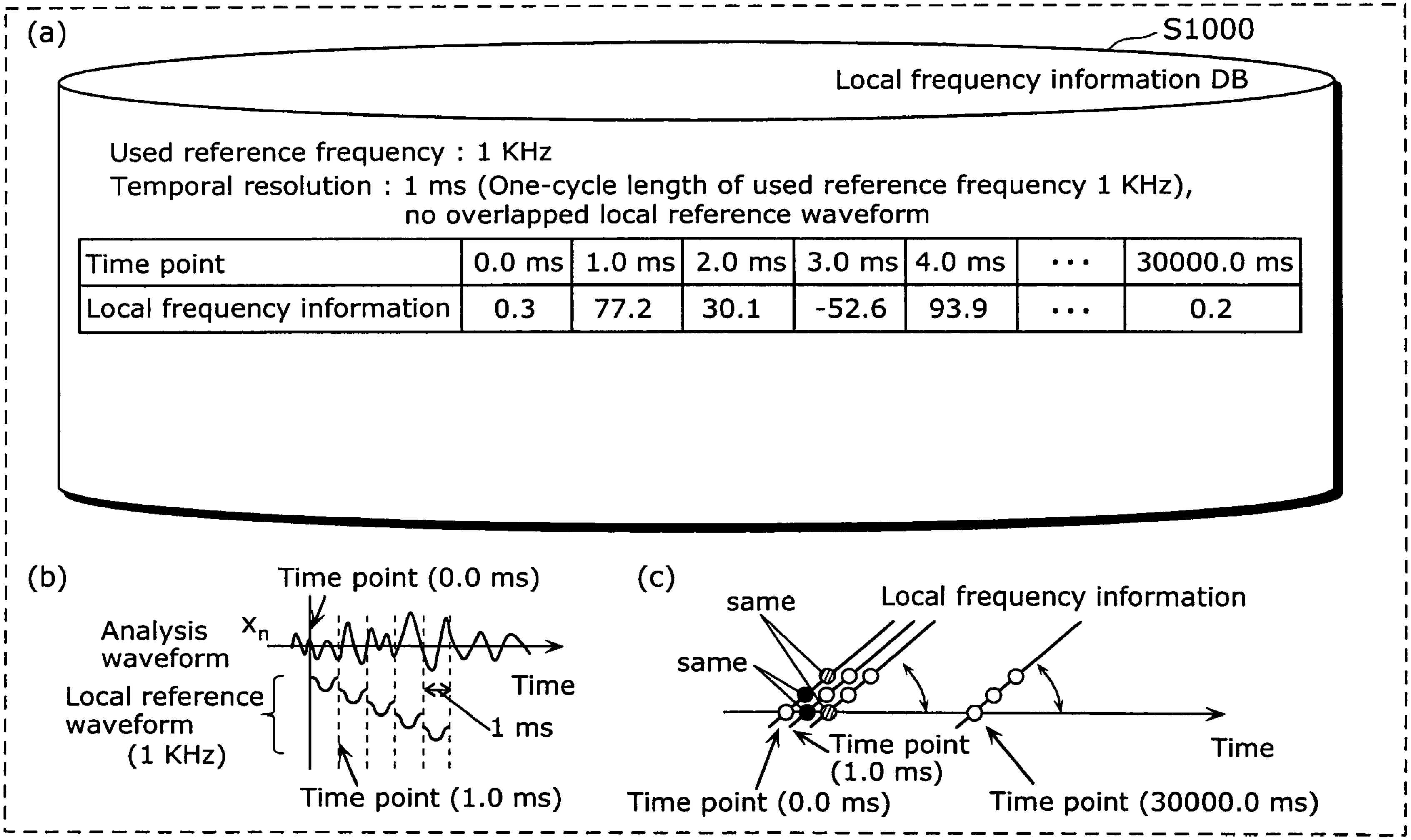
FIG. 25 is a diagram for illustrating a local frequency information DB to be generated by a local frequency information generation unit.

FIG. 25(*a*) shows an example of the local frequency information DB S1000. In this example, the representation of (3) the time points of the analysis waveform at which pieces of local frequency information S103 and the corresponding pieces of the local frequency information have been obtained are different from those in the example of the local frequency information DB of FIG. 20; that is, these pieces of local frequency information are arranged in the time direction. In other words, these three pieces of local frequency information at time point 1.0 ms are: the local reference information at time point 1.0 ms, the local frequency information at time point 2.0 and the local frequency information at time point 3.0; and these five pieces of local frequency information at time point 2.0 ms are: the local reference information at time point 2.0 ms, the local frequency information at time point 3.0, the local reference information at time point 4.0 ms, the local frequency information at time point 5.0 and the local frequency information at time point 6.0. The reason why these representations are possible is that the temporal resolution is 1.0 ms corresponding to one cycle of 1 KHz which is the reference frequency, and the temporal resolution of 1.0 is the same as the time-shifting interval by which a batch of integral pieces of local frequency information is temporally shifted with respect to the analysis waveform (refer to FIG. 25(*b*) and FIG. 25(*c*)). In other words, by temporally shifting the first-cycle local frequency information, the second-cycle and the following cycle local frequency information at the previous time point can be represented. Note that (1) the used analysis frequency and (2) the information of the shapes of the local reference waveforms are the same as those in the example of the local frequency information DB of FIG. 20.

FIG. 26 shows another example of the local frequency information DB 1000. In this example, unlike the example of the local frequency information DB of FIG. 25, the following is gathered in the database: (1) the used reference frequency, (2) the information of the shapes of the local reference waveforms, and (3) the time points of the analysis waveform at which pieces of local frequency information S103 and the corresponding pieces of local frequency information have been obtained. Also in the examples of FIG. 20, FIG. 21 and FIG. 22, pieces of local frequency information of plural used analysis frequencies may be gathered in the database in this way.

As describe above, the local frequency information DB S1000 is generated and stored.

The analysis waveform's frequency feature value extraction unit 106A includes a frequency resolution determination unit 1002. The analysis waveform's frequency feature value extraction unit 106A inputs the local reference information DB S1000, and based on the frequency resolution determined by the frequency resolution determination unit 1002, determines the number of pieces of local frequency information to be handled as a batch of data from among (3) the time points of the analysis waveform at which pieces of local frequencies and the corresponding pieces of local frequency information have been obtained.

Figure 27:
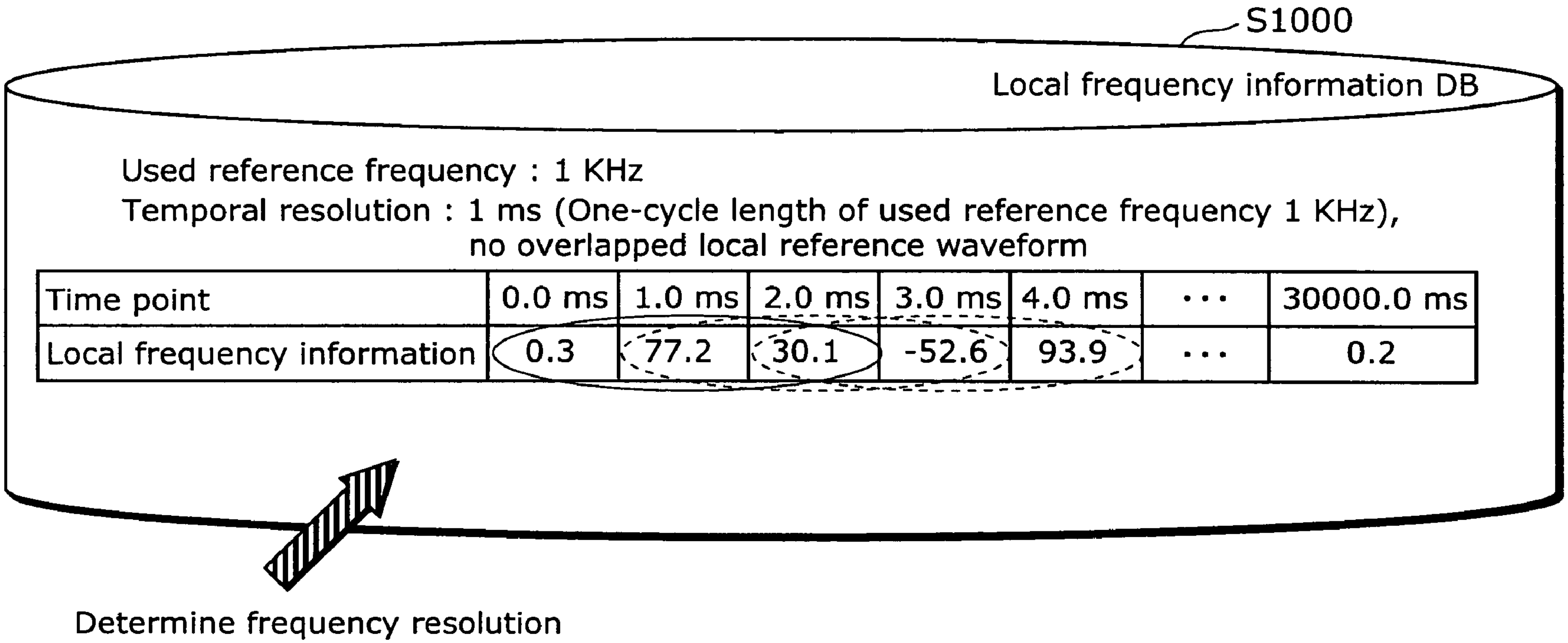
FIG. 27 is a diagram indicating an example of an analysis method of frequency feature values performed using a local frequency information DB.

FIG. 27 shows an example of an analysis method of frequency feature values in which the local frequency information DB S1000 is used. In this example, the relationship between the number of the pieces of local frequency information to be made into a batch and the frequency resolutions of the pieces of local frequency information are calculated based on the reference frequency of 1 KHz and the temporal resolution of 1 ms which are stored in the local frequency information DB S1000. The frequency feature value is analyzed, based on the frequency resolutions determined by the frequency resolution determination unit 1002 and using the three pieces of local frequency information as a batch of data. These three pieces of local frequency information in this example are: at time point 0.0 ms, the local frequency information at time point 0.0 ms, the local frequency information at time point 1.0 ms and the local frequency information at time point 2.0 ms which are enclosed by a solid circle in the figure; at time point 1.0 ms, the local frequency information at time point 1.0 ms, the local frequency information at time point 2.0 ms and the local frequency information at time point 3.0 ms which are enclosed by a broken circle in the figure; and at time point 2.0 ms, the local frequency information at time point 2.0 ms, the local frequency information at time point 3.0 ms and the local frequency information at time point 4.0 ms which are enclosed by a broken circle in the figure. Here, these batches of pieces of local frequency information are obtained at a time-shifting interval of 1.0 ms. A specific description is omitted as to the analysis method of the frequency feature value where each batch of the local frequency information is used because the analysis is performed using the same method as the method used by the analysis waveform's frequency feature value extraction unit 106 of FIG. 10.

Here, when five pieces of local frequency information need to be made into a batch, five pieces of local frequency information which are temporally continuous to each other may be made into a batch. Also, when ten pieces of local frequency information need to be made into a batch, ten pieces of local frequency information which are temporally continuous to each other may be made into a batch. Flexibility in the number of pieces of local frequency information to be made into a batch is greater than that of the example of FIG. 24.

Figure 28:
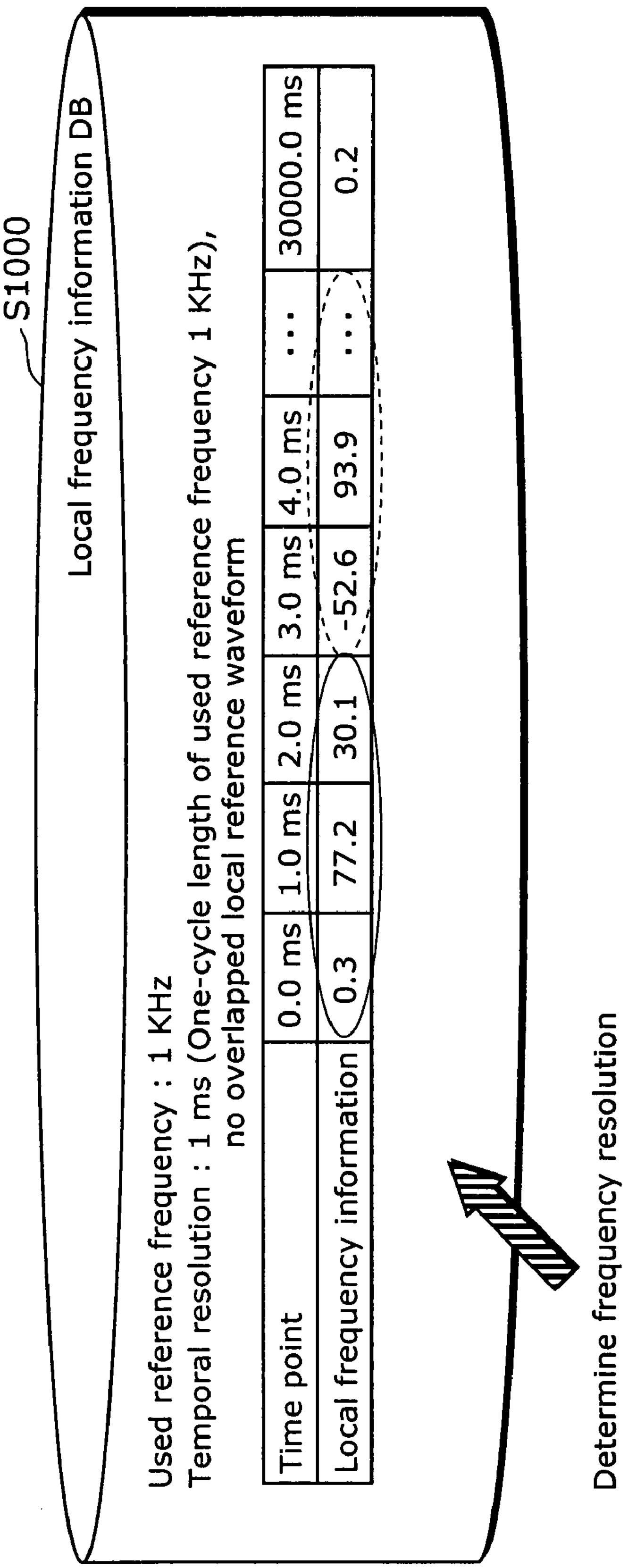
FIG. 28 is a diagram indicating an example of an analysis method of frequency feature values performed using a local frequency information DB.

FIG. 28 shows another example of an analysis method of frequency feature value using the local frequency information DB S1000. In this example, batches of pieces of local frequency information are obtained at a time-shifting interval of 3.0 ms (the solid circle and the broken circles in the figure). This time-shifting interval may be 5.0 ms or 8.0 ms. A time-shifting interval can be arbitrarily set in this way. A specific description is omitted as to the analysis method of the frequency feature value where each batch of the local frequency information is used because the analysis is performed using the same method as the method used by the analysis waveform's frequency feature value extraction unit 106 of FIG. 10.

As described above, the frequency feature value S104 is extracted.

When the frequency feature value analysis apparatus 1001 further includes a frequency resolution input receiving unit, it becomes capable of determining a frequency resolution based on an application specification and the like. Such frequency resolution may be inputted from outside.

INDUSTRIAL APPLICABILITY

The present invention is applicable to a mixed audio separation system, an audio recognition system, an audio identification system, a character recognition system, a face recognition system, an iris authentication system and the like.

The invention claimed is:

1. A mixed audio separation apparatus which separates a specific audio from among a mixed audio made up of audios, said apparatus comprising:

a local frequency information generation unit operable to obtain pieces of local frequency information corresponding to local reference waveforms, based on the local reference waveforms and an analysis waveform which is a waveform of the mixed audio, each of the local reference waveforms (i) constituting a part of a reference waveform for analyzing a predetermined frequency, (ii) having a predetermined temporal/spatial resolution and (iii) including at least one of an amplification spectrum and a phase spectrum in the predetermined frequency;

a specific audio's frequency feature value extraction unit operable to perform pattern matching between a first set which is the pieces of local frequency information and a second set of pieces of frequency information of a predetermined specific audio, and extract the first set of the pieces of local frequency information, based on a result of the pattern matching; and an audio signal generation unit operable to generate a signal of the specific audio, based on the first set of the pieces of local frequency information extracted by said specific audio's frequency feature value extraction unit.

2. The mixed audio separation apparatus according to claim 1, wherein said specific audio's frequency feature value extraction unit is operable to calculate a distance between the first set which is the pieces of local frequency information and the second set of the pieces of frequency information of the predetermined specific audio, and extract the first set of the pieces of local frequency information in the case where the distance is not more than a predetermined threshold value.

3. The mixed audio separation apparatus according to claim 1, wherein said specific audio's frequency feature value extraction unit is operable to calculate a similarity between the first set which is the pieces of local frequency information and the second set of the pieces of frequency information of the predetermined specific audio, and extract the first set of the pieces of local frequency information in the case where the similarity is not less than a predetermined threshold value.

4. The mixed audio separation apparatus according to claim 1, further comprising a reference waveform's time width determination unit operable to determine a time width of the reference waveform, based on a predetermined frequency resolution.

5. The mixed audio separation apparatus according to claim 4, wherein the reference waveform includes a cosine waveform or a sine waveform, and said reference waveform's time width determination unit is operable to determine, based on the predetermined frequency resolution, a time width of the reference waveform so that the reference waveform includes an integral number of cycles of a cosine waveform or an integral number of cycles of a sine waveform.

6. The mixed audio separation apparatus according to claim 5, wherein the integral number of cycles is one.

7. The mixed audio separation apparatus according to claim 4, further comprising a frequency resolution input receiving unit operable to receive an input of a frequency resolution, wherein said reference waveform's time width determination unit is operable to determine a time width of the reference waveform, based on the inputted frequency resolution.

8. The mixed audio separation apparatus according to claim 1, further comprising a reference waveform segmentation unit operable to segment the reference waveform, based on the predetermined temporal/spatial resolution and so that the resulting pieces of local reference waveforms are temporally overlapped with each other, so as to generate the pieces of local reference waveforms.

9. The mixed audio separation apparatus according to claim 8, wherein said reference waveform segmentation unit is operable to segment the reference waveform so as to generate the pieces of local reference waveforms having a plurality of temporal/spatial resolutions.

10. The mixed audio separation apparatus according to claim 8, further comprising a temporal/spatial resolution input receiving unit operable to receive an input of a temporal/spatial resolution, wherein said reference waveform segmentation unit is operable to segment the reference waveform, based on the inputted temporal/spatial resolution, so as to generate the local reference waveforms.

11. The mixed audio separation apparatus according to claim 1, further comprising a reference waveform segmentation unit operable to segment the reference waveform into the pieces of local reference waveforms, based on the predetermined temporal/spatial resolution and so that the resulting pieces of local reference waveforms are not temporally overlapped with each other.

12. A frequency analysis apparatus which performs frequency analysis of an analysis waveform using a reference waveform for analyzing a predetermined frequency, said apparatus comprising:

a local frequency information generation unit operable to obtain pieces of local frequency information corresponding to local reference waveforms, based on local reference waveforms and the analysis waveform, each of the local reference waveforms constituting a part of the reference waveform, having a predetermined temporal/spatial resolution and including at least one of an amplification spectrum and a phase spectrum in the predetermined frequency; and an analysis waveform frequency feature value extraction unit operable to extract frequency feature value included in the analysis waveform using a predetermined frequency resolution, using, as a set, the pieces of local frequency information obtained by said local frequency information generation unit, and based on the set and frequency information corresponding to the analysis waveform.

13. A local frequency information generation apparatus which generates frequency information for performing a frequency analysis of an analysis waveform using a reference waveform for analyzing a predetermined frequency, said apparatus comprising:

a local frequency information generation unit operable to obtain pieces of local frequency information corresponding to local reference waveforms, based on local reference waveforms and the analysis waveform, each of the local reference waveforms constituting a part of the reference waveform, having a predetermined temporal/spatial resolution and including at least one of an amplification spectrum and a phase spectrum in the predetermined frequency; and a storage unit operable to store the pieces of local frequency information as a set into a predetermined storage apparatus.

14. A frequency feature value analysis apparatus which performs a frequency analysis of an analysis waveform using a reference waveform for analyzing a predetermined frequency, said apparatus comprising:

an obtainment unit operable to obtain pieces of local frequency information corresponding to local reference waveforms, based on local reference waveforms and the analysis waveform, each of the local reference waveforms constituting a part of the reference waveform, having a predetermined temporal/spatial resolution and including at least one of an amplification spectrum and a phase spectrum in the predetermined frequency; and an analysis waveform frequency feature value extraction unit operable to extract frequency feature value included in the analysis waveform, using a predetermined frequency resolution, using, as a set, the pieces of local frequency information obtained by said obtainment unit, and based on the set and frequency information corresponding to the analysis waveform.

15. The frequency feature value analysis apparatus according to claim 14, further comprising a frequency resolution input receiving unit operable to receive an input of a frequency resolution, wherein said analysis waveform frequency feature value extraction unit is operable to determine a structure of the set of the pieces of local frequency information, based on the inputted frequency resolution.

16. A mixed audio separation method for separating a specific audio from among a mixed audio made up of audios, said method comprising:

a local frequency information generation step of obtaining pieces of local frequency information corresponding to local reference waveforms, based on the local reference waveforms and an analysis waveform which is a waveform of the mixed audio, each of the local reference waveforms constituting a part of a reference waveform for analyzing a predetermined frequency, having a predetermined temporal/spatial resolution and including at least one of an amplification spectrum and a phase spectrum in the predetermined frequency;

a specific audio's frequency feature value extraction step of performing pattern matching between a first set which is the pieces of local frequency information and a second set of pieces of frequency information of a predetermined specific audio, and extracting the first set of the pieces of local frequency information, based on a result of the pattern matching; and an audio signal generation step of generating a signal of the specific audio, based on the first set of the pieces of local frequency information extracted in said specific audio's frequency feature value extraction step.

17. A program for separating a specific audio from among a mixed audio made up of audios, said program causing a computer to execute:

a local frequency information generation step of obtaining pieces of local frequency information corresponding to local reference waveforms, based on the local reference waveforms and an analysis waveform which is a waveform of the mixed audio, each of the local reference waveforms constituting a part of a reference waveform for analyzing a predetermined frequency, having a predetermined temporal/spatial resolution and including at least one of an amplification spectrum and a phase spectrum in the predetermined frequency;

a specific audio's frequency feature value extraction step of performing pattern matching between the first set which is the pieces of local frequency information and a second set of pieces of frequency information of a predetermined specific audio, and extract the first set of the pieces of local frequency information, based on a result of the pattern matching; and an audio signal generation step of generating a signal of the specific audio, based on the first set of the pieces of local frequency information extracted in said specific audio's frequency feature value extraction step.

* * * * *